(12) United States Patent
Nojima

(10) Patent No.: US 12,080,370 B2
(45) Date of Patent: Sep. 3, 2024

(54) MEMORY DEVICE AND METHOD OF MANUFACTURING MEMORY DEVICE

(71) Applicant: KIOXIA CORPORATION, Tokyo (JP)

(72) Inventor: Kazuhiro Nojima, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 189 days.

(21) Appl. No.: 17/894,795

(22) Filed: Aug. 24, 2022

(65) Prior Publication Data

US 2023/0298633 A1   Sep. 21, 2023

(30) Foreign Application Priority Data

Mar. 17, 2022   (JP) .................................. 2022-042909

(51) Int. Cl.
*G11C 5/06* (2006.01)
*G11C 16/04* (2006.01)
*G11C 16/08* (2006.01)

(52) U.S. Cl.
CPC ............ *G11C 5/06* (2013.01); *G11C 16/0483* (2013.01); *G11C 16/08* (2013.01)

(58) Field of Classification Search
None
See application file for complete search history.

(56) References Cited

U.S. PATENT DOCUMENTS

| | | |
|---|---|---|
| 2008/0043388 A1 | 2/2008 | Kohama |
| 2019/0081053 A1 | 3/2019 | Nojima et al. |
| 2020/0089838 A1 | 3/2020 | Nojima et al. |
| 2022/0051741 A1* | 2/2022 | Choi ................ G11C 29/12015 |

FOREIGN PATENT DOCUMENTS

| | | |
|---|---|---|
| JP | 2006114618 A | 4/2006 |
| JP | 2019054102 A | 4/2019 |
| JP | 2020043296 A | 3/2020 |

* cited by examiner

*Primary Examiner* — Tan T. Nguyen
(74) *Attorney, Agent, or Firm* — Kim & Stewart LLP

(57) ABSTRACT

According to one embodiment, a device includes a memory cell array that includes a plurality of memory cells connected to a plurality of pieces of gate wiring, and a test control circuit that includes a plurality of control units connected to the plurality of pieces of gate wiring. The control units each includes a transistor that includes a gate connected to a first node, one end connected to the corresponding gate wiring and another end connected to a second node, and a load unit connected between the first node and the second node. When the gate wiring is being discharged, the transistor is turned on. The gate wiring is connected to the second node via the transistor in an on state. After the gate wiring is discharged, the load unit discharges the first node.

20 Claims, 24 Drawing Sheets

MEMORY DEVICE AND METHOD OF MANUFACTURING MEMORY DEVICE

CROSS-REFERENCE TO RELATED APPLICATION

This application is based upon and claims the benefit of priority from Japanese Patent Application No. 2022-042909, filed Mar. 17, 2022, the entire contents of which are incorporated herein by reference.

FIELD

Embodiments described herein relate generally to a memory device and a method of manufacturing a memory device.

BACKGROUND

A NAND-type flash memory that can store data in a nonvolatile manner is known.

DETAILED DESCRIPTION

Figure 1:
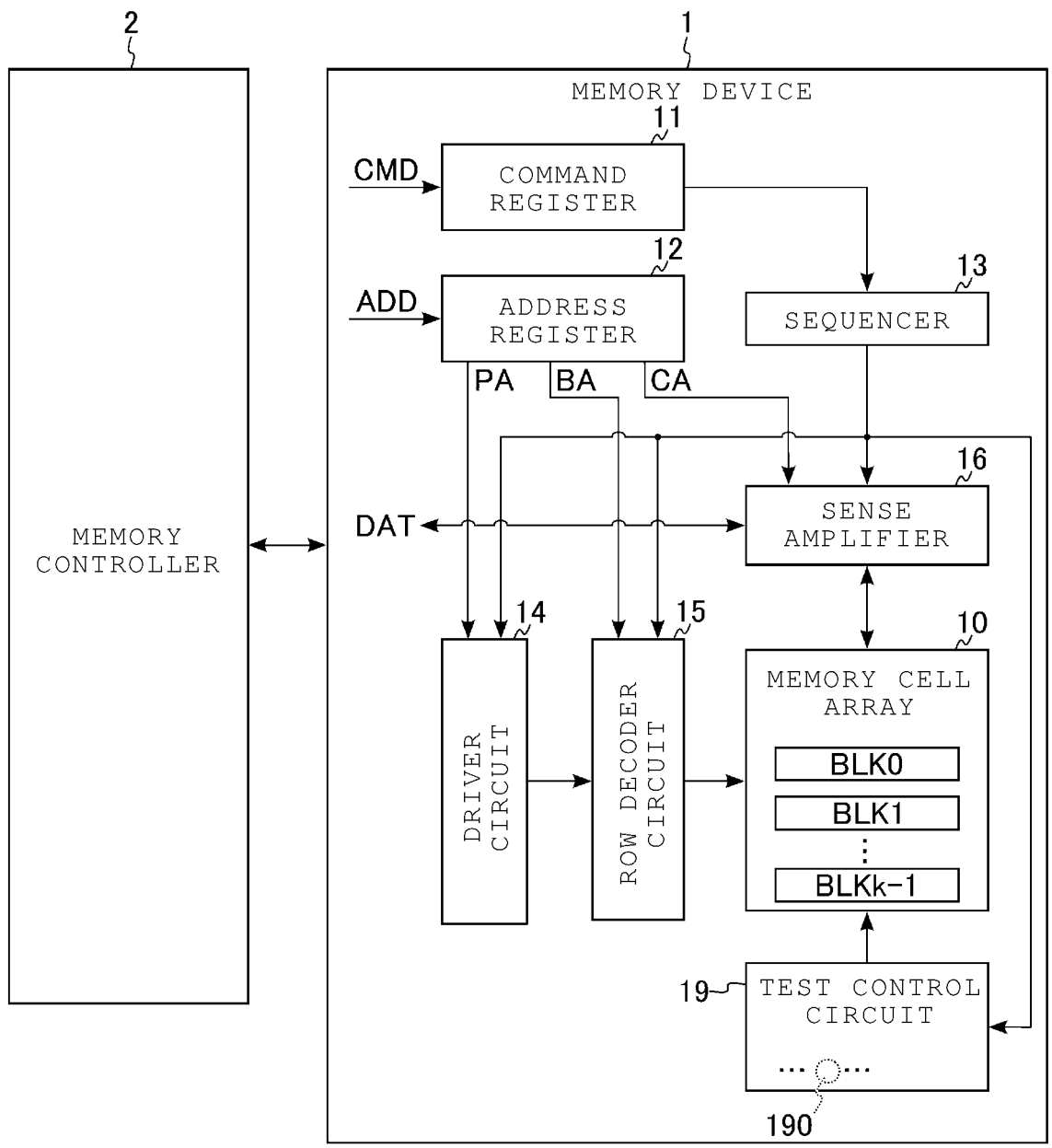
FIG. 1 is a block diagram illustrating of a memory device according to a first embodiment.

In general, according to one embodiment, a memory device includes a memory cell array that includes a plurality of pieces of gate wiring, and a plurality of memory cell transistors and a plurality of select transistors electrically connected to the plurality of pieces of gate wiring; and a test control circuit that includes a plurality of control units electrically connected to the plurality of pieces of gate wiring, and is configured to control discharging of the plurality of pieces of gate wiring during a test of the memory cell array, in which the control units each includes a field effect transistor that includes a gate electrically connected to a first node, one end electrically connected to at least one corresponding piece among the plurality of pieces of gate wiring, and another end electrically connected to a second node that is grounded, and a load unit that is electrically connected between the first node and the second node, in which, when the plurality of pieces of gate wiring are being discharged, the field effect transistor is set in an on state, the plurality of pieces of gate wiring each are electrically connected to the second node via the field effect transistor in the on state, and the load unit discharges the first node after the plurality of pieces of gate wiring are discharged.

A memory device and a method of manufacturing of a memory device according to certain example embodiments are described with reference to FIGS. 1 to 25.

In the following description, elements having the same function and configuration are denoted by the same reference numerals.

Further, in description of the example embodiments, when aspects or components (for example, circuits, wiring, various voltages and signals) having the same base reference symbols but with numerical or alphabetical suffixes appended thereto are not required to be distinguished from each other, then the base reference symbol without any suffix appended thereto may be taken to refer to all those elements sharing the same base reference symbol. When such elements are required to be distinguished from one another for purpose of description, then the suffixes will be used.

(1) First Embodiment

A memory device and a method of manufacturing a memory device (more particularly a test method) according to a first embodiment are described with reference to FIGS. 1 to 15.

(a) Configuration Example (a-1) Configuration of Memory Device 1

FIG. 1 is a block diagram illustrating an example of an overall configuration of a memory device 1. The memory device 1 can be controlled by an external memory controller 2. The memory device 1 is a semiconductor memory, and for example, is a NAND-type flash memory that can store data in a nonvolatile manner. If the memory device 1 is a NAND-type flash memory, the memory device 1 communicates with the memory controller 2 by various control signals and data transmission based on an interface standard relating to a NAND-type flash memory.

As illustrated in FIG. 1, the memory device 1 includes a memory cell array 10, a command register 11, an address register 12, a sequencer 13, a driver circuit 14, a row decoder circuit 15, a sense amplifier 16, and a test control circuit 19.

The memory cell array 10 includes blocks BLK0 to BLKk-1 (where k is an integer of 2 or more). Each block BLK is a set (group) of a plurality of memory cell transistor (hereinafter, also referred to as a memory cell) that can store data in a nonvolatile manner. In the NAND-type flash memory, the block BLK is used, for example, as a data erasing unit. A plurality of bit lines and a plurality of word lines are provided in the memory cell array 10. Each memory cell transistor is, for example, associated with one bit line and one word line. Specific configurations of the memory cell array 10 are described below.

The command register 11 stores a command CMD received from the memory controller 2. The command CMD might be an instruction for causing the sequencer 13 to perform a read operation, a write operation, an erasing operation, or the like.

The address register 12 stores address information ADD received from the memory controller 2. The address information ADD includes, for example, a block address BA, a page address PA (word line address), and a column address CA. For example, the block address BA, a page address PA, and the column address CA are used for selecting the block BLK, a word line, and a bit line, respectively.

The sequencer 13 controls operations of the entire memory device 1. For example, the sequencer 13 controls the driver circuit 14, the row decoder circuit 15, the sense amplifier 16, and the like based on the command CMD stored in the command register 11. Accordingly, the sequencer 13 performs a read operation, a write operation, an erasing operation, or the like.

The driver circuit 14 generates a voltage used in the read operation, the write operation, the erasing operation, and the like. The driver circuit 14 applies the generated voltage to wiring corresponding to the selected word line, for example, based on the page address PA stored in the address register 12.

The row decoder circuit 15 selects one block BLK in the corresponding memory cell array 10 based on the block address BA stored in the address register 12. The row decoder circuit 15 transmits the voltage applied to the wiring corresponding to the selected word line to the selected word line in the selected block BLK.

In the write operation, the sense amplifier 16 applies a desired voltage to each bit line according to write data DAT received from the memory controller 2. In the read operation, the sense amplifier 16 determines data stored in the memory cell based on the voltage of the bit line (or whether the current is generated in the bit line) and transmits a determination result to the memory controller 2 as read data DAT.

During a test of the memory device 1 (for example, an in-line inspection), the test control circuit 19 performs various kinds of control on the memory cell array 10. For example, the test control circuit 19 includes a plurality of control units 190. Each of the control units 190 controls voltage states of a plurality of pieces of wiring in the memory cell array 10.

Hereinafter, a set of circuits or respective circuits in the memory device 1 other than the memory cell array 10 are referred to as peripheral circuits (or CMOS circuits).

The memory device 1 and the memory controller 2 described above may configure one device (or one system) in combination. Examples of the device include memory card (for example, an SD™ card), a universal serial bus (USB) memory, a universal flash storage (UFS) device, and a solid state drive (SSD).

(a-2) Circuit Configuration of Memory Cell Array 10

Figure 2:
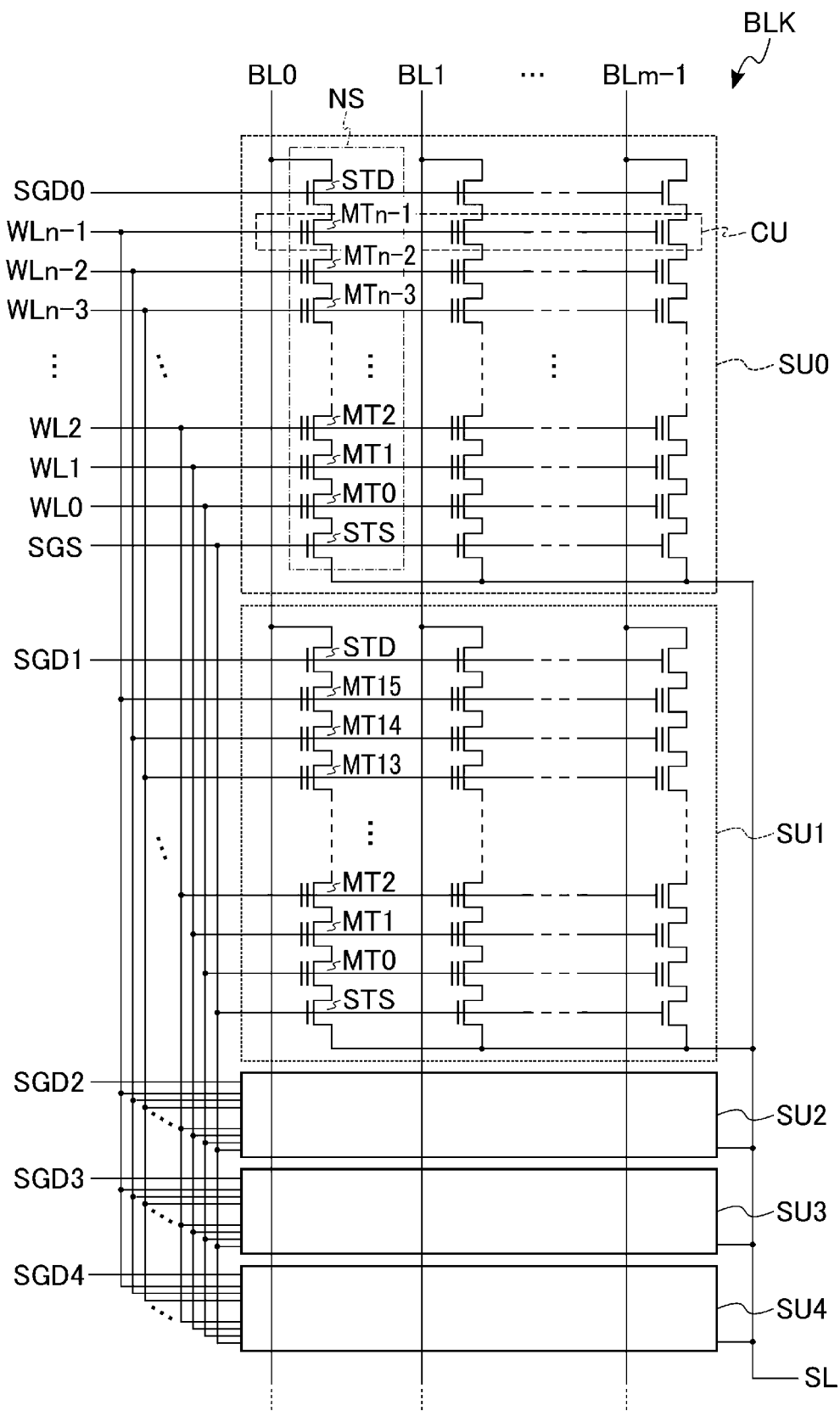
FIG. 2 is a circuit diagram illustrating of a memory cell array of a memory device according to a first embodiment.

FIG. 2 is a circuit diagram illustrating an example of the circuit configuration of the memory cell array 10 in the memory device 1 according to the present embodiment. FIG. 2 illustrates one block BLK of the plurality of blocks BLK provided in the memory cell array 10.

As illustrated in FIG. 2, the block BLK includes five string units SU0 to SU4.

Each string unit SU includes a plurality of NAND strings NS each associated with one of a plurality of bit lines BL0 to BLm-1 (where m is an integer of 2 or more). Each NAND string NS includes memory cell transistors MT0 to MTn-1 (where n is an integer of 2 or more) and select transistors STD and STS. Each memory cell transistor MT includes a control gate and a charge storage layer. Each of the memory cell transistors MT can store data in a substantially nonvolatile manner. The select transistors STD and STS each are used for selecting the string unit SU during various operations.

In each of the NAND strings NS, the memory cell transistors MT0 to MTn-1 are connected to each other in series. The drain of the select transistor STD is connected to one associated bit line BL among the plurality of bit lines BL0 to BLm-1. The source of the select transistor STD is connected to one end of the memory cell transistors MT0 to MTn-1 connected to each other in series. The drain of the select transistor STS is connected to the other end of the memory cell transistors MT0 to MTn-1 connected to each other in series. The source of the select transistor STS is connected to a source line SL.

The control gates of the memory cell transistors MT0 to MTn-1 are each connected to a different word line WL among a plurality of word lines WL0 to WLn-1.

The gates of the plurality of select transistors STS are connected to a select gate line SGS.

The gates of the plurality of select transistors STD in the string unit SU0 are connected to a select gate line SGD0. The gates of the plurality of select transistors STD in the string unit SU1 are connected to a select gate line SGD1. The gates of the plurality of select transistors STD in the string unit SU2 are connected to a select gate line SGD2. The gates of the plurality of select transistors STD in the string unit SU3 are connected to a select gate line SGD3. The gates of the plurality of select transistors STD in the string unit SU4 are connected to a select gate line SGD4.

Different column addresses are assigned to the bit lines BL0 to BLm-1, respectively. Each bit line BL is shared by the NAND strings NS to which the same column address is assigned among the plurality of blocks BLK. The select gate lines SGD0 to SGD4, and SGS and the word lines WL0 to WLn-1 are separately provided for each block BLK. The source line SL is, for example, shared by the plurality of blocks BLK.

A set of the memory cell transistors MT connected to the same word line WL in a string unit SU can be referred to as a cell unit CU. For example, the storage capacity of the cell unit CU with the memory cell transistors MT each storing 1-bit data is referred to as "one page". In some examples, the cell unit CU can have the storage capacity of two or more pages according to the number of bits of data storable per memory cell transistor MT.

The circuit configuration of the memory cell array 10 of the memory device 1 according to the first embodiment is not limited to the configuration described above. The number of the string units SU provided in each block BLK, the number of the memory cell transistors MT provided in each the NAND string NS, and the number of the select transistors STD and STS can be changed according to the circuit configuration of the memory cell array 10.

(a-3) Structural Example of Memory Cell Array 10

An example of the structure of the memory device 1 according to the present embodiment is described with reference to FIGS. 3 to 6. With respect to the drawings, description is made assuming an X direction corresponds to an extending direction (lengthwise direction) of the word lines WL, a Y direction corresponds to an extending direction (lengthwise direction) of the bit lines BL, and a Z direction corresponds to a direction orthogonal to a XY plane. In the plan view, hatching may be added in order to improve the depictional clarity of the drawings. The hatching added to such views is not necessarily related to any differences in the material types or other characteristic of the component to which the hatch is added. In the cross-sectional view, the illustration of certain aspects may be omitted as appropriate to improve the depictional clarity of the drawings. The configurations illustrated in each drawing are schematic and/or appropriately simplified.

Figure 3:
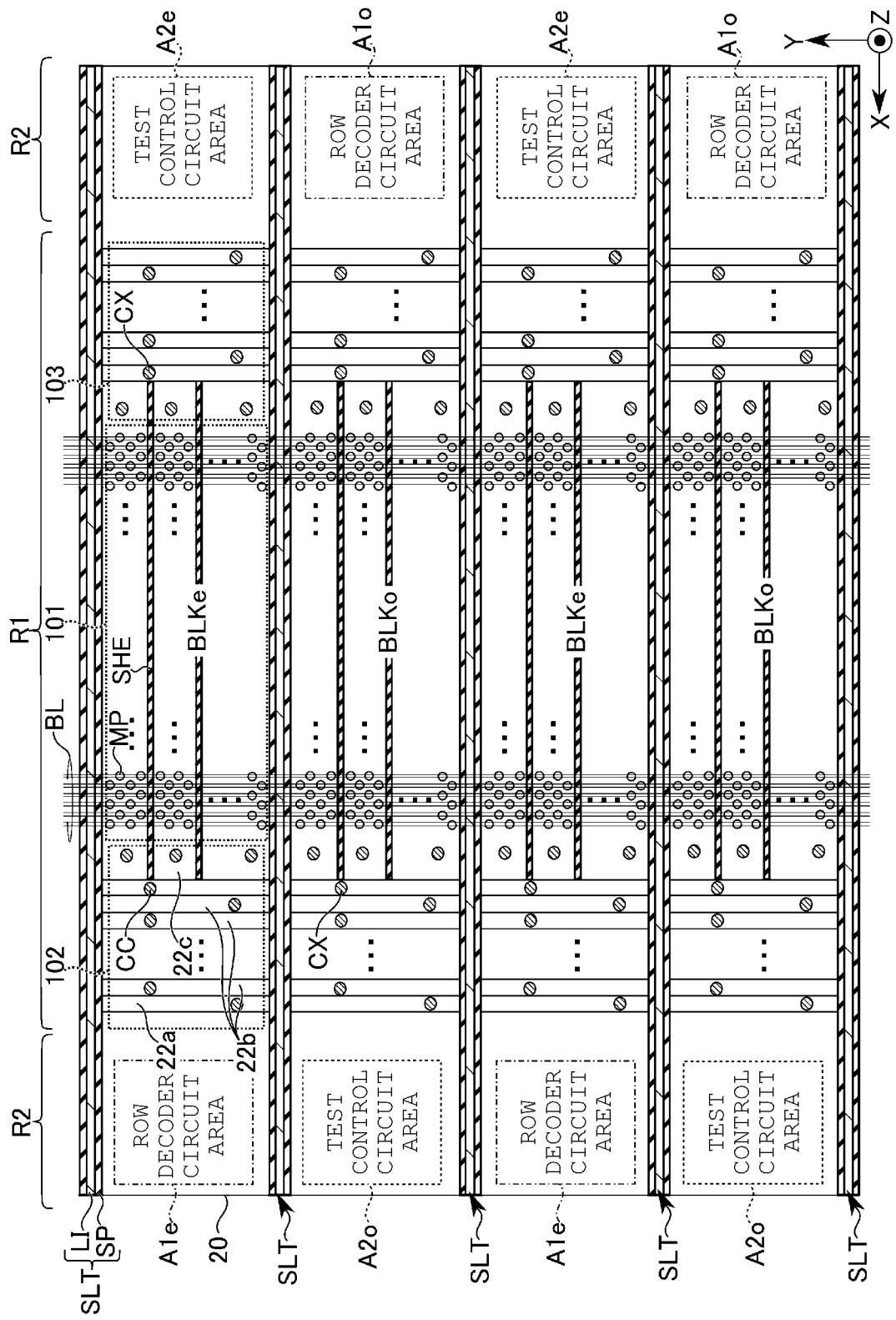
FIG. 3 is a top view of a memory device according to a first embodiment.

FIG. 3 is a plan view illustrating a layout of the memory cell array 10 and adjacent areas thereof in the memory device 1.

As illustrated in FIG. 3, the plurality of blocks BLK (BLKe and BLKo) are arranged along the Y direction and are provided in an area R1 (memory cell array area R1) in which the memory cell array 10 is disposed. Hereinafter, any even-numbered block BLK is referred to as a "block BLKe", and any odd-numbered block BLK is referred to as a "block BLKo".

A plurality of slits SLT are provided in the memory cell array area R1. The plurality of slits SLT are located in the Y direction. The slits SLT are provided between the blocks BLK adjacent to each other in the Y direction. The slits SLT have a portion extending in the X direction. Each slit SLT has a structure, for example, in which a spacer SP and the plate-shaped contact LI are embedded. Each slit SLT separates a plurality of adjacent conductive layers (the word lines WL0 to WLn-1 and the select gate lines SGD and SGS) 22 via the slits SLT. An area separated by the plurality of slits SLT corresponds to one block BLK.

Each block BLK includes the cell area 101 and the two hookup areas 102 and 103. In the X direction, the cell area 101 is provided between the two hookup areas 102 and 103.

A plurality of slits SHE are provided in the cell area 101. The plurality of slits SHE are located in the Y direction. The slit SHE has a structure in which an insulator is embedded. Each slit SHE separates the plurality of adjacent conductive layers 22c via the slit SHE. The area separated by the slits SLT and the slits SHE and the area separated by the two slits SHE correspond to one string unit SU.

A plurality of memory pillars MP are provided in the cell area 101. The plurality of memory pillars MP are located in the cell area 101 in the staggered arrangement layout. Each memory pillar MP is associated with one NAND string NS.

The plurality of bit lines BL extend in the Y direction. The plurality of bit lines BL are provided throughout the plurality of cell areas 101. For example, the bit lines BL pass above the memory pillars MP.

The plurality of conductive layers 22 (22a, 22b, and 22c) extend in the X direction. The plurality of conductive layers 22 are pulled out from the cell area 101 to hookup areas 102 and 103. The conductive layer 22a corresponds to the source-side select gate line SGS. The plurality of conductive layers 22b respectively correspond to the word lines WL. The conductive layer 22c corresponds to the drain-side select gate line SGD.

With respect to the even-numbered blocks BLKe, a plurality of contacts CC are provided in the hookup area 102. With respect to the odd-numbered block BLKo, the plurality of contacts CC are provided in the hookup area 103. Each of the contacts CC are provided on one corresponding layer among the plurality of conductive layers 22.

With respect to the even-numbered blocks BLKe, a plurality of contacts CX are provided in the hookup area 103. With respect to the odd-numbered block BLKo, the plurality of contacts CX are provided in the hookup area 102. Each contact CX is provided on one corresponding layer among the plurality of conductive layers 22.

In the memory device 1 according to the present embodiment, the memory cell array 10 and the peripheral circuits are provided on a common semiconductor substrate 20.

The peripheral circuits are provided in an area R2 (peripheral area R2) around the memory cell array area R1.

In the peripheral area R2, a plurality of areas A1 (row decoder circuit areas A1) in which components of the row decoder circuit 15 are provided near the memory cell array 10. Hereinafter, any row decoder circuit area A1 corresponding to an even-numbered block BLKe is referred to as a "row decoder circuit area A1e", and any row decoder circuit area A1 corresponding to an odd-numbered block BLKo is referred to as a "row decoder circuit area A1o". For the even-numbered blocks BLKe, each row decoder circuit area A1e is adjacent to the hookup area 102 of the block BLKe corresponding in the X direction. For the odd-numbered blocks BLKo, each row decoder circuit area A1o is adjacent to the hookup area 103 of the block BLKo corresponding in the X direction.

In the peripheral area R2, a plurality of areas A2 (test control circuit areas A2) in which components of the test control circuit 19 are provided are near the memory cell array 10. Hereinafter, a test control circuit area A2 corresponding to an even-numbered block BLKe is referred to as a "test control circuit area A2e", and a test control circuit area A2 corresponding to an odd-numbered block BLKo is referred to as a "test control circuit area A2o". For the even-numbered block BLKe, the test control circuit area A2e is adjacent to the hookup area 103 of the block BLKe corresponding in the X direction. For the odd-numbered block BLKo, the test control circuit area A2o is adjacent to the hookup area 102 of the block BLKo corresponding in the X direction.

Each block BLK is provided between one row decoder circuit area A1 and one test control circuit area A2 in the X direction.

With respect to the even-numbered block BLKe, the row decoder circuit area A1e is provided on one end side of the memory cell array area R1 in the X direction, and the test control circuit area A2e is provided on the other end side of the memory cell array area R1.

With respect to the odd-numbered blocks BLKo, the row decoder circuit area A1o is provided on the other end side of the memory cell array area R1 in the X direction, and the test control circuit area A2 is provided on one end side of the memory cell array area R1.

In the Y direction, the row decoder circuit area A1 is adjacent to the test control circuit area A2 via the slit SLT.

The components in the row decoder circuit area A1 (for example, transistors) are electrically connected to a corresponding layer among the plurality of conductive layers 22 via a contact CC and wiring.

The components in the test control circuit area A2 (for example, transistors) are electrically connected to a corresponding layer among the plurality of conductive layers 22 via a contact CX and wiring.

Figure 4:
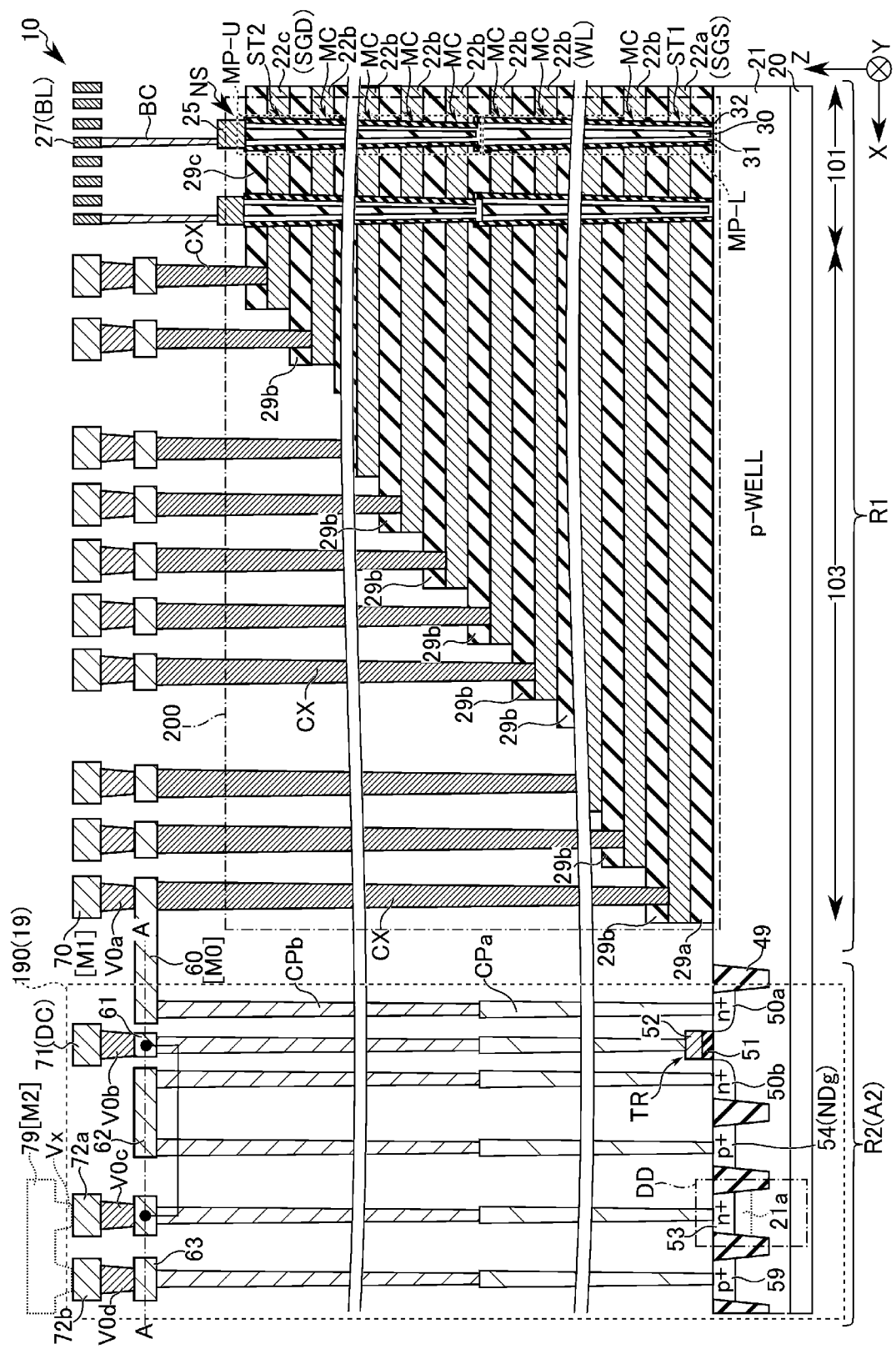
FIG. 4 is a cross-sectional view of a memory device according to a first embodiment.
Figure 5:
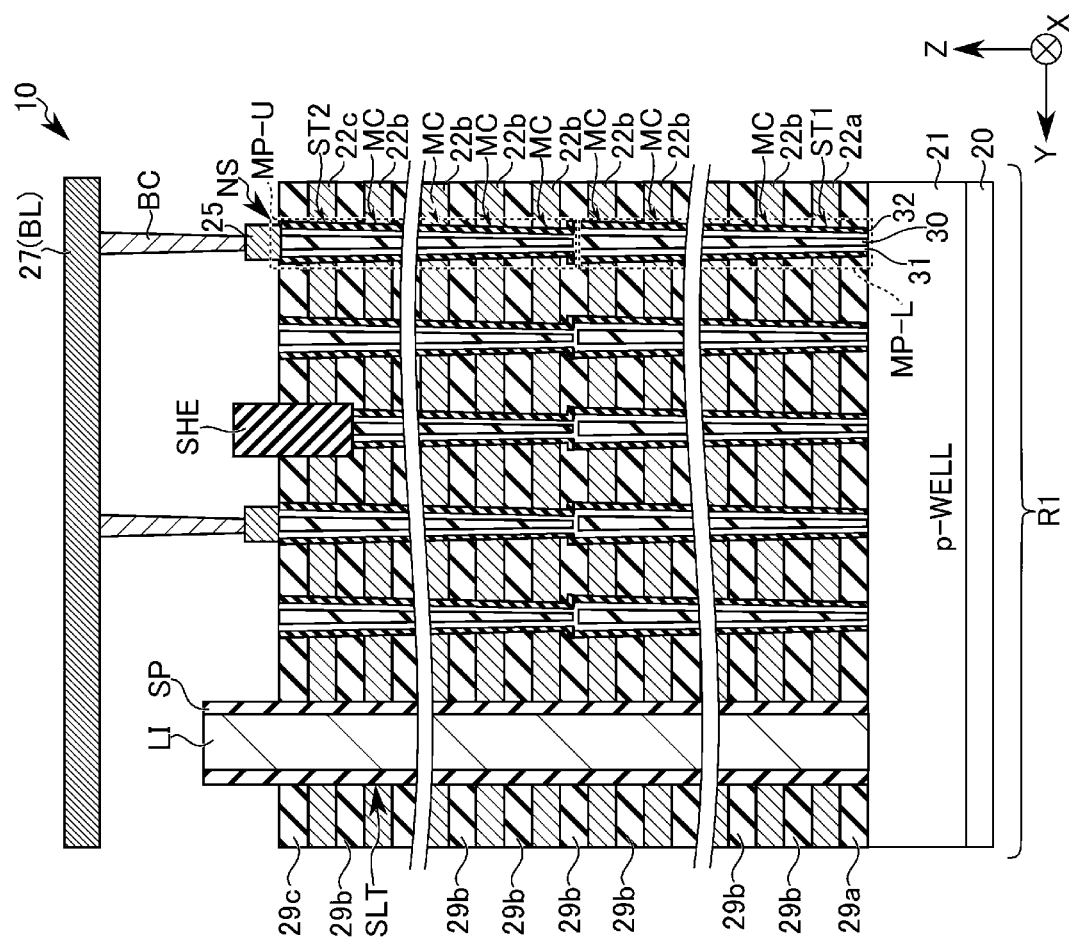
FIG. 5 is a cross-sectional view of a memory device according to a first embodiment.

FIGS. 4 and 5 illustrate cross-sectional structures of the memory cell array 10 and adjacent areas thereof in the memory device 1 according to the present embodiment. FIG. 4 illustrates a cross section of the memory cell array 10 that is taken along an X-Z plane (the X direction). FIG. 5 illustrates a cross section of the memory cell array 10 that is taken along a Y-Z plane (the Y direction).

As illustrated in FIGS. 4 and 5, the memory cell array 10 includes a p-type well region 21, the memory pillars MP, the plurality of conductive layers 22, a plurality of insulating layers 29.

In the memory cell array 10, the p-type well region 21 is provided in the semiconductor substrate 20. The p-type well region 21 is grounded.

The plurality of conductive layers 22 (22a, 22b, and 22c) and the plurality of insulating layers 29 (29a, 29b, and 29c) are stacked on the p-type well region 21 of the semiconductor substrate 20 in the Z direction. The conductive layers 22 and the insulating layers 29 extend from the cell area 101 to the hookup area 103 (and the hookup area 102) in the X direction.

The conductive layers 22 are located in the Z direction. Each insulating layer 29 is provided between two conductive layers 22 located in the Z direction. The conductive layers 22 adjacent in the Z direction are separated by the insulating layers 29.

The insulating layer 29a is provided on the upper surface of the p-type well region 21.

The conductive layer 22a is provided on the upper surface of the insulating layer 29a. The conductive layer 22a as the source-side select gate line SGS is, for example, a plate-shaped layer expanded along an X-Y plane. For example, the conductive layer 22a includes tungsten.

The plurality of conductive layers 22b and the plurality of insulating layers 29b are alternately stacked on the upper surface of the conductive layer 22a. The conductive layers 22b are plate-shaped layers, for example, expanding along the X-Y plane. The stacked plurality of conductive layers 22b are respectively used as the word lines WL0 to WLn-1 in an order from the semiconductor substrate 20 side. For example, the conductive layer 22b includes tungsten.

The conductive layer 22c is provided over the uppermost conductive layer 22b via the insulating layer 29b. The conductive layer 22c as the drain-side select gate line SGD is a plate-shaped layer, for example, expanding along the X-Y plane. For example, the conductive layer 22c includes tungsten. The insulating layer 29c is provided on the upper surface of the conductive layer 22c.

Hereinafter, a structural body configured with the plurality of conductive layers 22 and the plurality of insulating layers 29 stacked in the Z direction is referred to as a stacked body (or stacked wiring) 200. The conductive layers 22 each become gate electrodes of the memory cell transistors MT or the select transistors STD and STS are referred to as gate wiring (or gate layers).

The plurality of memory pillars MP (MP-L and MP-U) are respectively provided in a stacked body 200. The memory pillar MP is a structural body in a columnar shape which extends in the Z direction. The memory pillars MP penetrate the plurality of conductive layers 22 and the plurality of insulating layers 29.

The lower end of the memory pillar MP in the Z direction is in contact with the p-type well region 21. The upper end of the memory pillars MP in the Z direction exposes from the upper surface of the insulating layer 29c. For example, a conductive layer 25 is provided on the upper end of the memory pillar MP.

A portion where the memory pillar MP and the conductive layer 22a intersect functions as the select transistor STS. A portion where the memory pillar MP and one conductive layer 22b intersect functions as one memory cell transistor MT. A portion where the memory pillar MP and the conductive layer 22c intersect functions as the select transistor STD.

For example, one NAND string NS includes two memory pillars MP-U and MP-L. In this case, two memory pillars MP-U and MP-L are stacked in the Z direction. The memory pillar MP-U is provided on the memory pillar MP-L in the Z direction.

The memory pillars MP-L and MP-U each include a core layer 30, a semiconductor layer 31, and a memory layer 32. The semiconductor layer 31 is provided between the core layer 30 and the memory layer 32 in the X direction and the Y direction. The memory layer 32 is provided between the semiconductor layer 31 and the stacked body 200 (the conductive layers 22 or the insulating layers 29) in the X direction and the Y direction. The core layer 30 includes, for example, an insulator such as silicon oxide. The semiconductor layer 31 includes, for example, silicon.

One end (upper end) of the semiconductor layer 31 of the memory pillar MP-U in the Z direction is connected to the conductive layer 25. The other end (lower end) of the semiconductor layer 31 of the memory pillar MP-U in the Z direction is connected to one end (upper end) of the semiconductor layer 31 of the memory pillar MP-L in the Z direction. The other end (lower end) of the semiconductor layer 31 of the memory pillar MP-L in the Z direction is connected to the p-type well region 21. For example, the memory layer 32 of the memory pillar MP-L is connected to the memory layer 32 of the memory pillar MP-U.

Further, the NAND string NS may be configured with one memory pillar MP. In this case, one memory pillar MP extends from the upper end to the lower end in the Z direction of the stacked body 200.

An end portion of the stacked body 200 in the X direction has a stepped shape in the hookup area 103 (and the hookup area 102). Accordingly, in the hookup area 103, a certain conductive layer 22 has a portion in which the upper surface thereof is not covered with the other upper conductive layer 22. The portion in which the upper surface of each conductive layer 22 is not covered with the other conductive layer 22 can be referred to as a terrace.

In the hookup area 103 (or the hookup area 102), the contacts CX (or the contacts CC) are provided on the terraces of the conductive layers 22. The contacts CX (CC) cause the conductive layers 22 to be connected to a conductive layer 60 (wiring) provided in an upper wiring level M0. The conductive layer 60 is connected to a conductive layer 70 via a via V0a. The conductive layer 70 is provided in a wiring level M1 above the wiring level M0.

For example, in the hookup area 103 of the test control circuit area A2 side, the conductive layer 70 is used as a node for inspection in the test operation of the memory device 1. The conductive layer 70 in the hookup area 103 can be referred to as an inspection node. The inspection node (a conductive layer 70) is, for example, a pad. The upper surface of the conductive layer 70 may be expose from the interlayer insulating film on the semiconductor substrate 20, or may be covered with the interlayer insulating film.

Further, the wiring levels M0 and M1 designate positions (heights or hierarchies) in the Z direction from the upper surface of the semiconductor substrate 20.

As illustrated in FIG. 5, the slit SLT has a portion provided, for example, along the X-Z plane.

A contact LI in the slit SLT is provided along the slit SLT. The lower end of the contact LI is in contact with the p-type well region 21. Accordingly, the contact LI is electrically connected to the memory pillar MP via the p-type well region 21. The contact LI is used, for example, as a portion of the source line SL. The contact LI includes, for example, a conductor such as tungsten.

The spacer SP in the slit SLT is provided between the contact LI and the conductive layer 22. The contact LI is separated and insulated from the conductive layer 22 by the spacer SP. The spacer SP includes, for example, an insulator such as silicon oxide.

The slit SHE has a portion, for example, provided along the X-Z plane. For example, the slit SHE is provided above a memory pillar (also referred to as a dummy pillar) MP that is not used as an element. The slit SHE separates at least the conductive layer 22c. The slit SHE includes, for example, an insulator such as silicon oxide.

A conductive layer 27 is provided above the conductive layer 22c via an insulating layer or the like. The conductive layer 27 is, for example, a line-shaped layer extending in the Y direction. The conductive layer 27 is used as a bit line BL. The conductive layer 27 comprises, for example, copper.

The conductive layer 27 is electrically connected to the memory pillars MP via contacts BC and the conductive layers 25. The contacts BC are provided between the conductive layer 27 and the conductive layer 25.

Further, in FIG. 5, the memory pillars MP that are not connected to the conductive layers 25 and the slits SHE are connected to the conductive layer 27 via the other conductive layers 25 and the other contacts BC provided in the depth direction (or the front direction) of the drawing.

Figure 6:
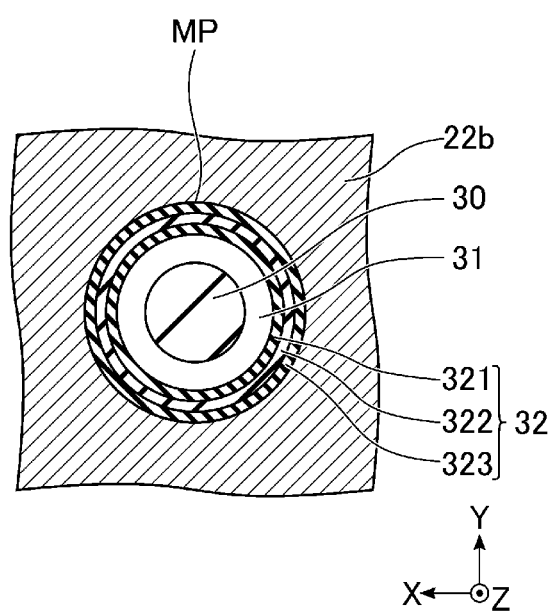
FIG. 6 is a cross-sectional view of a memory device according to a first embodiment.

FIG. 6 is a cross-sectional view illustrating an example of the cross-sectional structure of the memory pillar MP in the memory device 1 according to the present embodiment. In FIG. 6, a cross-sectional structure of the memory pillar MP that is parallel to the front surface of the semiconductor substrate 20 (the X-Y plane) at a position including the conductive layer 22 is illustrated.

As illustrated in FIG. 6, in the cross section including the conductive layer 22, the core layer 30 is provided in the central portion of the memory pillar MP. The semiconductor layer 31 surrounds the side surface of the core layer 30. The memory layer 32 surrounds the side surface of the semiconductor layer 31.

The memory layer 32 is a stacked film. For example, the memory layer 32 includes a tunnel insulating film 321, a charge trap film 322, and a block insulating film 323.

The tunnel insulating film 321 surrounds the side surface of the semiconductor layer 31. The charge trap film 322 surrounds the side surface of the tunnel insulating film 321.

The block insulating film 323 surrounds the side surface of the charge trap film 322. The side surface of the block insulating film 323 is surrounded by the conductive layer 22 (or the insulating layer 29). The charge trap film 322 is provided between the tunnel insulating film 321 and the block insulating film 323.

The tunnel insulating film 321 functions as a tunnel barrier between the semiconductor layer 31 and the charge trap film 322. The tunnel insulating film 321 includes, for example, silicon oxide.

The charge trap film 322 is used as a charge storage layer of the memory cell transistor MT. The charge trap film 322 can store charges injected via the tunnel insulating film 321. The charge trap film 322 includes, for example, silicon nitride.

The block insulating film 323 blocks the movement of the charges between the charge trap film 322 and the conductive layers 22. The block insulating film 323 includes, for example, silicon oxide and aluminum oxide.

In each memory pillar MP, the semiconductor layer 31 is used as channel areas (current paths) of the memory cell transistors MT and the select transistors STD and STS. The memory device 1 can cause the currents to flow via the memory pillars MP between the bit lines BL and the contacts LI (the source line SL) by turning on the memory cell transistors MT and the select transistors STD and STS.

As illustrated in FIGS. 3 and 4, components of peripheral circuits such as the test control circuit 19 are provided on the semiconductor substrate 20 together with the memory cell array 10.

During the test of the memory device 1 according to the present embodiment, characteristics of the memory cell transistor MT and characteristic of the select transistors STD and STS are measured (inspected) based on a luminance of the memory pillar MP (also referred to as voltage contrast: VC) observed due to the currents (electrons) flowing in the memory pillar MP.

During the test operation, the test control circuit 19 can control the voltage state of the gate wiring 22 such as the word line WL and the select gate lines SG (SGD and SGS).

(a-4) Configuration Example of Test Control Circuit 19

The configuration example of the test control circuit 19 is described with reference to FIGS. 7 and 8. Further, the structure of the test control circuit 19 is described with reference to FIG. 4.

Figure 7:
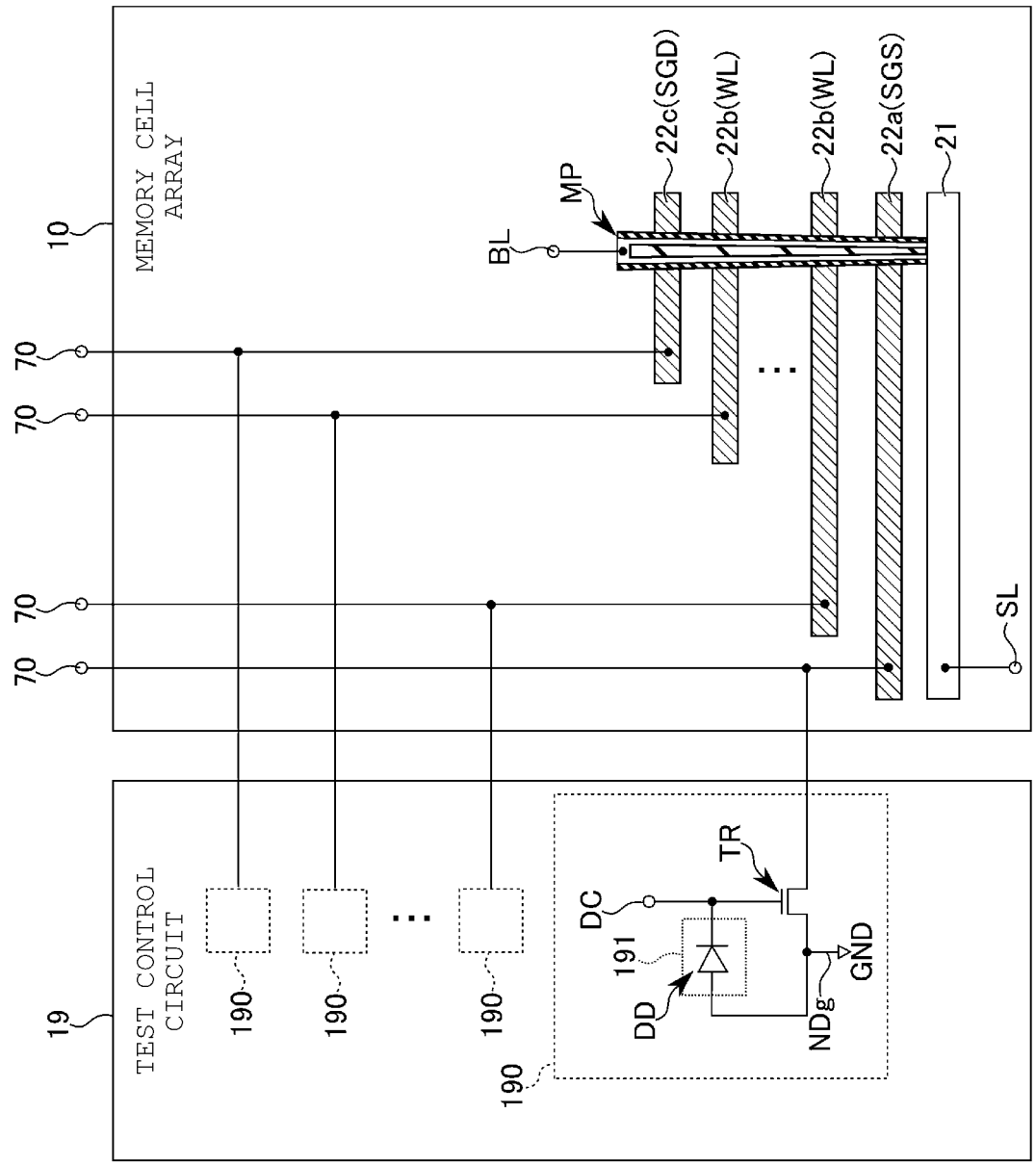
FIG. 7 is a circuit diagram of a test control circuit of a memory device according to a first embodiment.

FIG. 7 is circuit diagram illustrating the configuration example of the test control circuit 19 of the memory device 1 according to the present embodiment.

As illustrated in FIG. 7, the test control circuit 19 includes the plurality of control units 190.

Each of the control units 190 corresponds to any one of the select gate line SGS, the word lines WL0 to WLn-1, and the select gate line SGD. Each of the plurality of control units 190 is electrically connected to one corresponding to gate wirings (the conductive layers 22) as the word lines WL and the select gate lines SGD and SGS.

The control unit 190 discharges (destaticizes) the gate wiring 22 during the test of the memory device 1.

The control unit (also referred to as a discharge unit) 190 includes a field effect transistor TR and a load unit (also referred to as a discharge element) 191.

The field effect transistor TR functions as a switch (switching element) for controlling electrical connection between the gate wiring 22 and a node NDg. The field effect transistor TR is, for example, a MOS transistor.

The load unit 191 functions as a load when the voltage state (electrified state) of the gate wiring 22 is controlled.

For example, the load unit 191 contributes to the discharge (destaticization) of a node DC. In the present example, the load unit 191 includes a PN junction diode DD.

The gate of the field effect transistor TR is connected to the node DC. One end (one of the two source and drain) of the current path of the field effect transistor TR is electrically connected to the gate wiring 22. The other end (the other of the two source and drain) of the current path of the field effect transistor TR is electrically connected to the node NDg. One end of the load unit 191 is electrically connected to the node NDg. The other end of the load unit 191 is electrically connected to the node DC.

If the load unit 191 is the PN junction diode DD, the anode of the PN junction diode DD is electrically connected to the node NDg, and the cathode of the PN junction diode DD is electrically connected to the node DC. Further, the anode of the diode DD is connected to the current path (source/drain) of the field effect transistor TR. The cathode of the diode DD is connected to the gate of the field effect transistor TR. The gate of the field effect transistor TR is connected to the node NDg via the diode DD.

The node DC is a control terminal that discharges the gate wiring 22. The node DC is also referred to as the discharge node DC or control node DC.

The node NDg is a grounded terminal GND (a terminal to which a ground voltage is applied). The node NDg is also referred to as the ground node NDg. For example, the ground node NDg is provided in the semiconductor substrate 20.

During the operation of the control unit 190 in the test of the memory device 1, the control unit 190 is activated by irradiating the discharge node DC with the charged particle beam.

The discharge node DC is electrified to a positive voltage with the charged particle beam. Accordingly, the field effect transistor TR is turned on.

If the discharge node DC is electrified to a positive voltage, the PN junction diode DD operates in a reverse bias state. The output current of the PN junction diode DD in the reverse bias state is smaller than the output current of the PN junction diode DD in the forward bias state.

Therefore, by the irradiation with the charged particle beam in a predetermined intensity, a voltage of the discharge node DC can be maintained at a predetermined intensity (for example, a voltage equal to or larger than the threshold voltage of the field effect transistor TR) without the affection of the discharge by the PN junction diode DD.

Accordingly, even if the PN junction diode DD operates in the reverse bias state, the field effect transistor TR can be maintained in an on state during the period when the discharge node DC is irradiated with the charged particle beam.

When the irradiation of the discharge node DC with the charged particle beam is stopped, the discharge node DC is discharged by the output current of the PN junction diode DD in the reverse bias state.

Further, in the example described above, the operation of the control unit 190 using the charged particle beam is described. However, the control unit 190 of the test control circuit 19 may operate in a state in which the entire surface of the wafer on which the memory device 1 is formed is electrified by using a charging device such as an ionizer, a plasma generator, or the like.

In this case, the gate wiring 22 and the discharge node DC are electrified at the same time, by the charging device. By electrification of the discharge node DC, the PN junction diode DD enters in a reverse bias state, and the field effect transistor TR enters in an on state. At this point, in the gate wiring 22, discharging (destaticization) and electrification (charging) occur at the same time.

When the electrification process on the entire surface of the wafer by the charging device is stopped, discharging of the gate wiring 22 via the field effect transistor TR in an on state proceeds. Due to the delay of the discharging of the gate wiring 22, the discharge node DC is discharged due to the output current of the PN junction diode DD in a reverse bias state. According to the decrease of the voltage of the discharge node DC, the field effect transistor TR enters in an off state. Accordingly, the discharging of the gate wiring 22 by the control unit 190 is completed.

The structure of the control unit 190 of FIG. 7 is described with reference to FIGS. 4 and 8.

Figure 8:
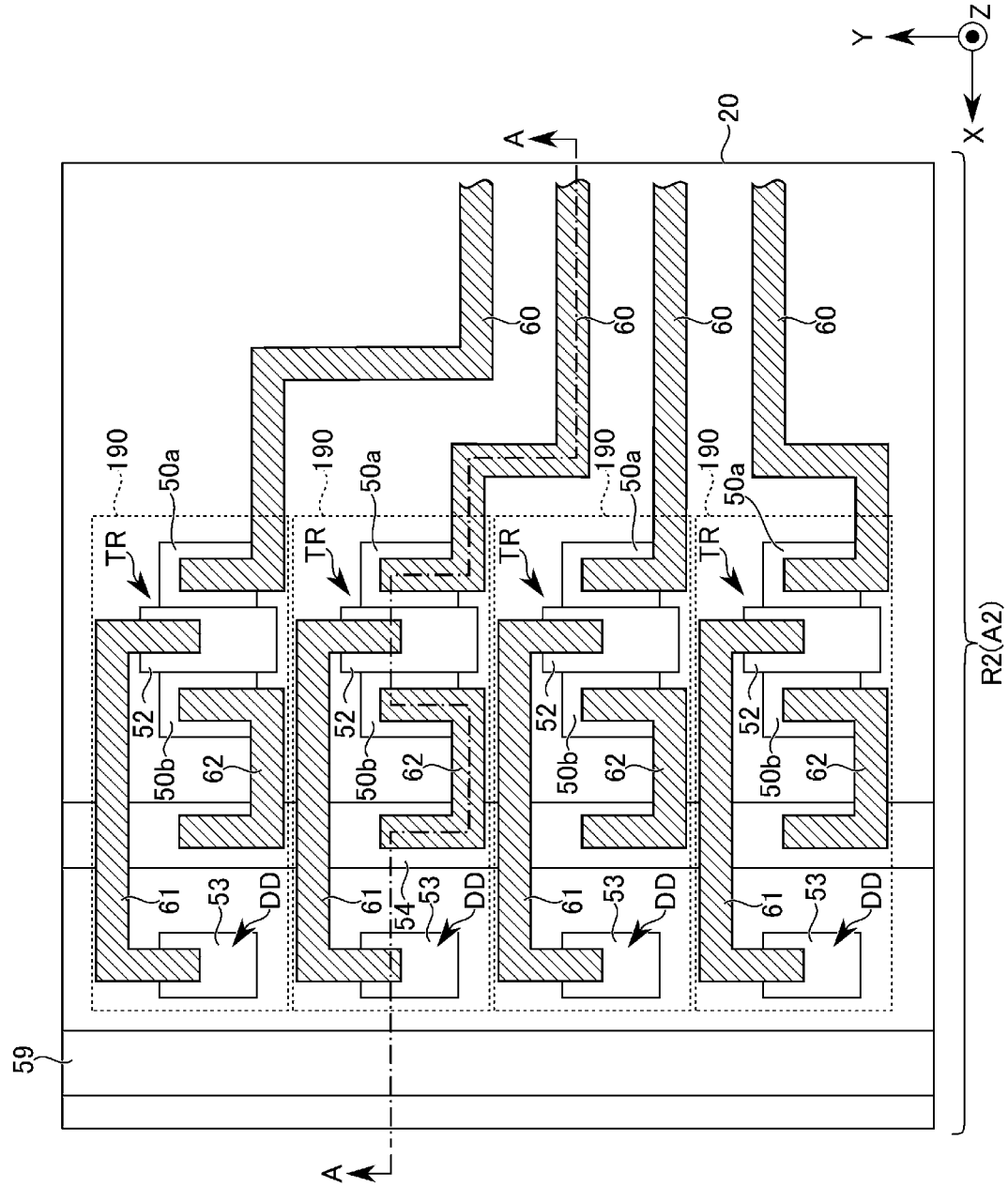
FIG. 8 is a top view of a test control circuit of a memory device according to a first embodiment.

FIG. 8 is a top view of the layout of the control units 190 in the test control circuit 19 of the memory device 1 according to the present embodiment. The cross-sectional structure of the control unit 190 of FIG. 4 has a structure taken along the line A-A of FIG. 8.

As illustrated in FIGS. 4 and 8, the plurality of control units 190 are located on the semiconductor substrate 20 in the Y direction.

The control unit 190 is electrically connected to the corresponding gate wiring 22 via the conductive layer 60 provided in the wiring level M0 above the semiconductor substrate 20.

In the control units 190, the field effect transistor TR and the diode DD are connected to each other and simultaneously electrically connected to the nodes DC and NDg via the conductive layers 61 and 62 and the contacts CP (CPa and CPb) provided in the wiring level M0 above the semiconductor substrate 20. Each of the conductive layers 61 and 62 has a concave planar shape. Accordingly, the plurality of conductive layers 61 and 62 are disposed in the same wiring level M0 in a comparatively smaller area. Further, the field effect transistor TR and the diode DD may be connected by using the conductive layer in the wiring level M1 above the wiring level M0.

The field effect transistor TR and the diode DD each are provided in an active area of the semiconductor substrate 20. The active area is a semiconductor region (semiconductor layer) surrounded by the element separation layer 49. According to the present embodiment, the active area is formed from the p-type well region 21. An element separation layer 49 includes an insulator such as silicon oxide.

The field effect transistor TR includes two source/drain layers 50a and 50b, a gate insulation layer 51, and a gate electrode 52. The field effect transistor TR is an n-channel enhancement type MOS transistor.

The two source/drain layers 50a and 50b are provided in the p-type well region 21. The source/drain layers 50a and 50b are n-type impurity semiconductor layers (diffusion layers). The two n-type source/drain layers 50a and 50b are located in the X direction via the p-type well region 21. The area between the source/drain layers 50a and 50b are used as the channel area of the field effect transistor TR.

The gate insulation layer 51 is provided on the upper surface of the p-type well region 21.

The gate electrode 52 is provided on the gate insulation layer 51. The gate electrode 52 faces the channel area in the p-type well region 21 via the gate insulation layer 51. The gate insulation layer 51 includes silicon oxide. The gate electrode 52 includes a conductor such as polysilicon and silicide.

The PN junction diode DD includes an impurity semiconductor layer 53 and an impurity semiconductor layer 21a.

The impurity semiconductor layer 53 is provided in the p-type well region 21. The impurity semiconductor layer 53 is a high-concentration n-type semiconductor region (diffusion layer). The impurity semiconductor layer 21a is adjacent to the impurity semiconductor layer 53 in the Z direction. The impurity semiconductor layer 21a is a p-type semiconductor region. The impurity semiconductor layer 21a is a layer continuous with the p-type well region 21.

In this manner, by providing the n-type semiconductor layer (cathode layer) in the p-type well region 21 (anode layer), the PN junction of the diode DD is formed.

The ground node NDg includes an impurity semiconductor layer 54. The impurity semiconductor layer 54 is provided in the p-type well region 21. The impurity semiconductor layer 54 is a high-concentration p-type semiconductor region. The impurity semiconductor layer 54 extends in the Y direction. The impurity semiconductor layer 54 is provided throughout the plurality of control units 190 as the common node NDg. The impurity semiconductor layer 54 is electrically connected to the p-type well region 21.

The source/drain layer 50a of the field effect transistor TR is connected to the contacts CX via the contacts CPa and CPb and the conductive layer 60. Accordingly, the field effect transistor TR is electrically connected to the corresponding gate wiring 22. Further, the contacts CPb are stacked on the contacts CPa in the Z direction.

The source/drain layer 50b of the field effect transistor TR is electrically connected to the p-type impurity semiconductor layer 54 as the ground node NDg via two sets of the contacts CPa and CPb and the conductive layer 62.

The gate electrode 52 of the field effect transistor TR is connected to a conductive layer 71 via the contacts CPa and CPb, the conductive layers 61, and a via V0b. The conductive layer 71 is used as the discharge node DC. The conductive layer 71 as the discharge node DC is, for example, a pad. The upper surface of the conductive layer 71 may be exposed from an interlayer insulating film or may be covered with the interlayer insulating film.

The n-type impurity semiconductor layer 53 of the diode DD is connected to the conductive layer 71 as the discharge node DC via the contacts CPa and CPb, the conductive layers 61, and the via V0b. The impurity semiconductor layer 53 is electrically connected to the gate electrode 52 of the field effect transistor TR via the conductive layer 61. In addition, the impurity semiconductor layer 53 is electrically connected to the impurity semiconductor layer 54 via the impurity semiconductor layer 21a and the p-type well region 21.

For example, the conductive layer 61 is electrically connected to a conductive layer 72a via a via V0c. The conductive layer 72a is separated from the conductive layer 71.

For example, a p-type impurity semiconductor layer 59 is disposed in the test control circuit area A2. The impurity semiconductor layer 59 is provided in the p-type well region 21. The impurity semiconductor layer 59 is electrically connected to a conductive layer 72b via the contacts CPa and CPb, a conductive layer 63, and a via V0d. For example, the impurity semiconductor layer 59 is grounded.

The impurity semiconductor layer 59 is a component for setting the test control circuit 19 and the control units 190 to a disable state.

In the memory device 1 according to the present embodiment, after the test step in the state of the wafer, the conductive layer 72b is short-circuited with the conductive layer 72a via a conductive layer 79 and a via Vx. Accordingly, the cathode of the diode DD (the impurity semiconductor layer 53) and the gate of the field effect transistor TR (the gate electrode 52) are grounded. As a result, the control units 190 are disable.

For example, the memory device 1 according to the present embodiment becomes commercially available in a state in which the test control circuit 19 and the control units 190 are disable (state in which the conductive layer 79 and the via Vx are provided in the memory device 1), and used by the user.

(b) Test Method

The test method of the memory device according to the present embodiment is described with reference to FIGS. 9 to 15.
<Principle>

The principle of the test operation of the memory device 1 according to the present embodiment is described with reference to FIG. 9.

When a gate voltage is applied to the memory cell transistors MT or the select transistors ST (STD and STS), a channel is formed in the semiconductor layer 31 of the memory pillar MP. The channel forms according to the intensity (level) of the applied gate voltage and the threshold voltage of the transistor MT or ST.

The source line SL is electrically connected to the bit lines BL via the channel of the transistor MT or ST that forms.

If the charging (charges) of the memory pillars MP are observed by a measuring instrument such as an electron microscope, a contrast between light and dark (differences in image brightness) occurs according to the amount of charge in the channel of the semiconductor layer 31 and the intensity (amount) of the current flowing in the channel will be apparent in an image. Such an observed contrast or difference in brightness in the imaging provides a visualization of the charges.

For example, in the semiconductor layer 31 of the memory pillar MP, a portion in which the channel is not presently formed or a portion through which the current does not flow will be displayed in an electronic image (e.g., a micrograph) as a dark portion as a result of accumulated charges from the electron beam being used to generate the image.

However, for the semiconductor layer 31 of the memory pillar MP in the portions where the channel is presently formed, and the portion through which the current flows will be displayed on the electronic image as a bright portion. The luminance of the bright portion changes according to the size of the current that flows in the channel. For example, the luminance when the current flow in the channel is large will be higher than the luminance when the current flow in the channel is small.

Therefore, electrical characteristics of the transistors MT and ST in the NAND strings NS including the memory pillar MP can be obtained on at least a relative basis from the luminance of the memory pillar MP in the electronic image taken as a measure of the charges in the memory pillar MP or portions thereof.

According to the present embodiment, the drain current-gate voltage characteristics (Id-Vg characteristics) of the transistors MT and ST are calculated based on the observed luminance of the memory pillar MP as the measuring of the charges.

According to the present embodiment, the drain currents of the transistors MT and ST to be measured are converted (inferred) from the observed luminance (VC) of the memory pillar MP. The gate voltage of the transistor MT or ST (the voltage of the gate wiring 22) during the test operation is controlled by the irradiation of the inspection node 70 (connected to the gate wiring 22) with a charged particle beam (for example, an electron beam) at a certain intensity (e.g., a dose rate, a charge per area per time or the like for the charged particle beam). The gate voltage level is converted (inferred) from the number of irradiations (exposure events) the charged particle beam (corresponding to an accumulated exposure dose) applied to the connected inspection node 70.

Figure 9:
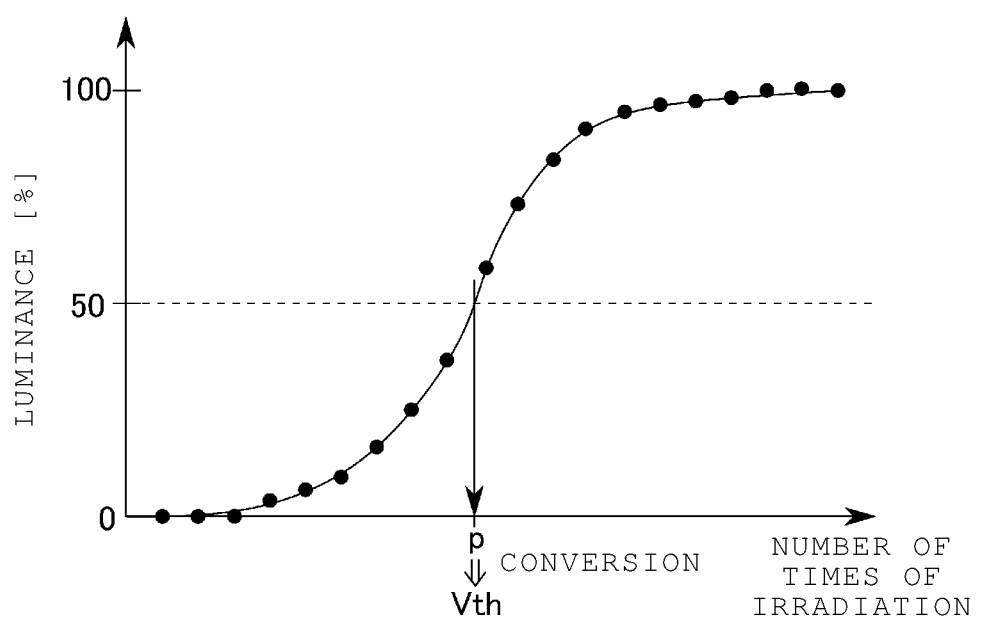
FIG. 9 is a graph related to an explanation of the principle of a test operation of a memory device according to a first embodiment.

FIG. 9 is a graph illustrating a relationship between the irradiation with the charged particle beam and the observed luminance. In FIG. 9, the horizontal axis of the graph indicates the "number of times of the irradiation" (accumulated exposure dose) with the charged particle beam, and the vertical axis of the graph indicates the "luminance" (normalized observed brightness) level of the memory pillar (channel).

As a method of calculating the threshold voltage of the transistor by using the Id-Vg characteristic of the transistor, a GmMax extrapolation method, a constant current method, and the like are known.

For example, in the GmMax extrapolation method, the tangent to the curve thereof in a gate voltage Vg at which the slope of the curve showing the drain current-gate voltage (Id-Vg) characteristic becomes the maximum value is calculated. The voltage value of the intersection between the tangent thereof and the axis corresponding to the gate voltage (Id=0) is defined as the threshold voltage of the transistor.

For example, in the constant current method, the voltage value of the gate voltage Vg at which a certain current value set relating to a drain current Id is obtained is defined as the threshold voltage of the transistor.

According to the present embodiment, the threshold voltage of the memory cell transistor MT or the select transistor ST to be measured is calculated by applying the constant current method to the relationship between the "number of times of the irradiation" with the charged particle beam and the "luminance" of the memory pillar MP. As described above, the luminance of the memory pillar MP is associated with the drain current of the transistor MT or ST.

For example, as illustrated in FIG. 9, with respect to the luminance measured for the memory pillar MP, the maximum value of the observed luminance is standardized to 100%, and the minimum value of the observed luminance is standardized to 0%. A threshold voltage Vth of the transistor MT or ST to be measured is converted from the "number of times of the irradiation" (value p) of the gate wiring 22 at which the luminance becomes 50%.

In this manner, the threshold voltage Vth of the transistors MT, STD, or STS can be obtained based on the measurement of the luminance of the memory pillar MP.

<Inspection Method>

The inspection method of a transistor to be measured in the test operation of the memory device according to the present embodiment is described with reference to FIG. 10.

For example, in a known manufacturing process, in order to form the gate wiring 22 (the word lines WL and the select gate lines SGD and SGS) in the memory device 1, a replacement process in which an insulating (sacrificial) layer is replaced by a conductive layer is performed. It is likely that the film thickness of the memory layer 32 (for example, the block insulating film 323) under various conditions of this replacement process and the position dependence from the slits SLT may change or vary.

According to the change of the film thickness of the memory layer 32 caused by such a manufacturing process, the threshold voltages of the memory cell transistors MT and the select transistors STD and STS can vary as a function of process variations or positional differences within the same device, or the like.

As described above, the NAND string NS has the configuration in which the plurality of memory cell transistors MT and the select transistors STD and STS are connected between the bit lines BL and the source line SL in series. Therefore, the characteristics (for example, the Id-Vg characteristics) of the transistor having the highest threshold voltage among the plurality of transistors MT, STD, and STS in the NAND string NS become dominant in the characteristics of the NAND string NS.

Accordingly, the characteristics of the NAND strings NS and the memory device 1 can be evaluated by measuring the threshold voltages of the memory cell transistors MT and the select transistors STD and STS in the NAND string.

Figure 10:
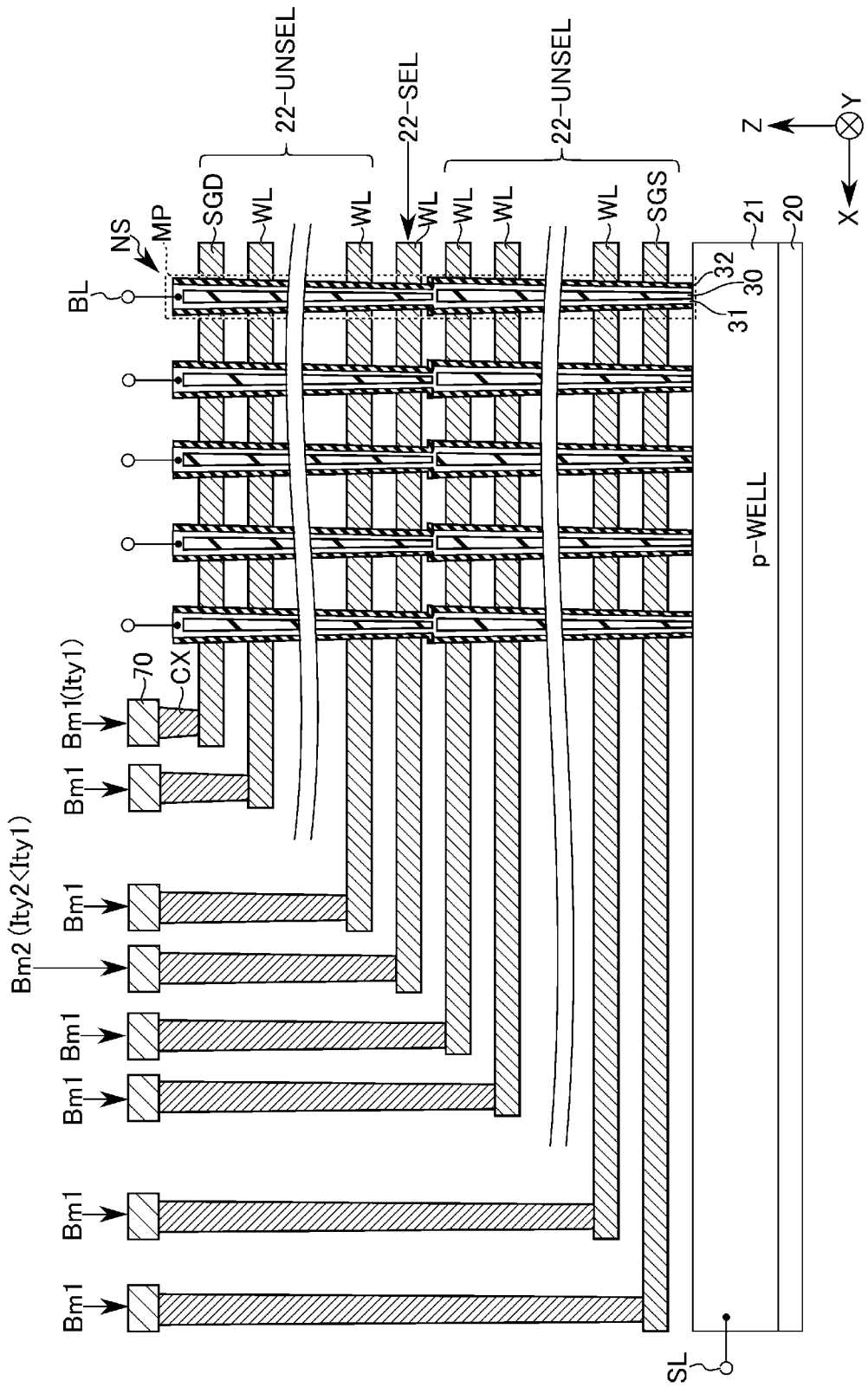
FIG. 10 is a diagram illustrating aspects of a test operation of a memory device according to a first embodiment.

FIG. 10 is a schematic diagram illustrating the inspection method in the test operation of the memory device 1 according to the present embodiment.

As illustrated in FIG. 10, when characteristics of the transistor connected to a specific gate wiring 22-SEL among the plurality of pieces of gate wiring 22 are measured, an electrified state (voltage state) of the specific gate wiring 22-SEL to which the transistor to be measured is connected and electrified states of the plurality of pieces of gate wiring 22-UNSEL other than the specific gate wiring 22-SEL are controlled during the testing.

In the following, the gate wiring 22-SEL corresponding to the transistor (the memory cell transistor MT or the select transistor ST) for which the characteristic is to be measured is referred to as a select gate wiring or a selected gate wiring, and the gate wiring 22-UNSEL (the gate wirings 22 other than the select gate wiring 22-SEL) is referred to as an unselect gate wiring or an unselected gate wiring.

When a characteristic of the memory cell transistor MT of the select gate wiring 22-SEL is to be measured, the unselect gate wiring 22-UNSEL is electrified, for example, by irradiating the inspection node 70 connected to the unselected gate wirings 22 with a charged particle beam Bm1 at a certain intensity Ity1. Accordingly, gate voltages of the threshold voltage or more are applied to the transistors MT, STD, and STS connected to the unselected gate wiring 22-UNSEL. The transistors MT, STD, and STS connected to the unselect gate wiring 22-UNSEL are thus turned on. In this example, the transistors MT, STD, and STS connected to the unselect gate wiring 22-UNSEL are activated by irradiation with the charged particle beam Bm1 one time. However, in other examples, the transistors MT, STD, and STS connected to the unselect gate wiring 22-UNSEL may be activated by the irradiation with the charged particle beam Bm1 two or more times (e.g., multiple beam passes).

The characteristic of the transistor MT to be measured is measured with the transistors MT, STD, and STS connected to the unselect gate wiring 22-UNSEL are turned on.

As an initial state of the measurement, the transistor MT to be measured (the selected transistor MT) is in an off state. That is, the voltage of the select gate wiring 22-SEL is substantially 0 V.

The gate voltage of the selected transistor MT is gradually increased by irradiation of the inspection node 70 connected to the select gate wiring 22-SEL with a charged particle beam Bm2 of a certain intensity Ity2. The intensity Ity2 of the charged particle beam Bm2 is smaller than the intensity Ity1 of the charged particle beam Bm1.

The select gate wiring 22-SEL is irradiated with the charged particle beam Bm2 a plurality of times (j times, where j is an integer of 2 or more).

The memory pillar MP of the transistor to be measured is observed by a measuring device each time of inspection node 70 for the select gate wiring 22-SEL is irradiated with the charged particle beam Bm2, the luminance of the memory pillar MP is measured and calculated at each exposure step (charge particle beam Bm2 irradiation).

For example, the irradiation with the charged particle beam Bm2 is repeated until the luminance value of the memory pillar MP is saturated. A value at which the luminance of the memory pillar MP becomes saturated is set as the luminance of 100%.

The luminance of 50% for the memory pillar MP is then calculated based on the saturation measurement result.

As described with reference to FIG. 9, the irradiation level p (corresponding to number of times or amount the inspection node 70 is irradiated with the charged particle beam Bm2) corresponding to the luminance of 50% is calculated. The threshold voltage Vth of the selected transistors MT (or ST) to be measured is obtained based on the irradiation level p of the charged particle beam Bm2.

In FIG. 10, an example in which the word line WL is set as the select gate wiring 22-SEL is illustrated. Here, in order to measure the threshold voltages of the select transistors STD and STS, the select gate lines SGD and SGS can be set as the select gate wiring 22-SEL.

When threshold voltages of the plurality of transistors MT, STD, and STS in the NAND strings NS are calculated, the select gate wiring 22-SEL may be changed in an order from the source-side select gate line SGS to the drain-side select gate line SGD and may be changed in an order from the drain-side select gate line SGD to the source-side select gate line SGS. The test operation may be performed by using a certain number of pieces of the gate wiring 22 among the plurality of pieces of gate wiring 22-SEL as the select gate wiring 22-SEL, without setting all of the gate wiring 22 connected to the NAND string NS to the select gate wiring 22-SEL.

<Test Device>

Figure 11:
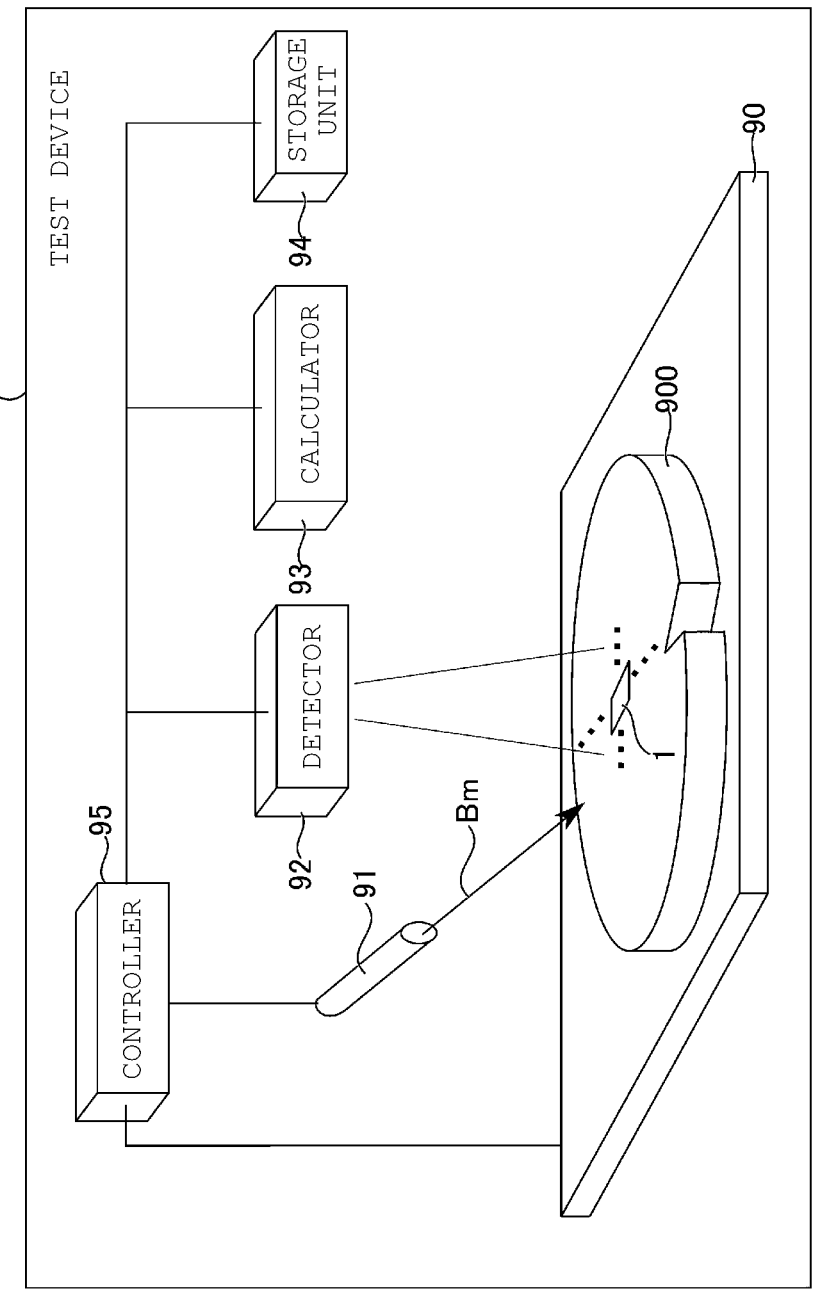
FIG. 11 is a diagram illustrating aspects of a test operation of a memory device according to a first embodiment.

FIG. 11 is a schematic diagram illustrating test device 9 that performs the test of the memory device 1 according to the present embodiment.

The test device 9 performs a test operation (in-line inspection) on the plurality of memory devices 1 in a wafer 900.

The test device 9 includes a stage unit 90, a charged particle beam irradiation unit 91, a detector 92, a calculator 93, a storage unit 94, and a controller 95.

In the test device 9, the stage unit 90 stores the wafer 900 on which the plurality of memory devices 1 are formed. For example, the stage unit 90 can adjust the position of the wafer 900 on the stage unit 90.

The charged particle beam irradiation unit 91 irradiates the memory device 1 of the wafer 900 with the charged particle beam Bm. The gate wiring 22 and the discharge node DC in the memory device 1 are electrified by the irradiated charged particle beam Bm. The charged particle beam Bm is, for example, an electron beam.

The detector 92 detects the charge generated in the memory pillar MP of the memory device 1 according to the irradiation with the charged particle beam. The detector 92 can form electronic image (a secondary electronic image and a reflected electronic image) based on the detected charge.

The calculator 93 performs various calculation processes relating to the test operation. For example, the calculator 93 calculates the luminance of a portion to be measured (for example, the semiconductor layer 31 of the memory pillar MP) from an image formed by the detector 92. The calculator 93 can calculate the threshold voltage Vth of the memory cell transistor MT or the select transistors STD or STS based on the measured luminance and the irradiation level applied with the charged particle beam Bm.

The storage unit 94 stores a detection result obtained by the detector 92, a calculation result obtained by the calculator 93, various kinds of information relating to the test operation, and the like.

The controller 95 controls operations of each unit 90 to 93 in the test device 9. For example, the intensity of the charged particle beam Bm applied by the charged particle beam irradiation unit 91, the amount of the irradiation, the irradiation area (e.g., beam spot size) of the charged particle beams Bm, or the electron detection and image formation parameters for the detector 92 can be controlled.

<Process Flow>

The test operation of the memory device 1 according to the present embodiment is described with reference to FIGS. 12 to 15.

As described below, the test device 9 performs the test operation on the memory device 1 according to the present embodiment.

Figure 12:
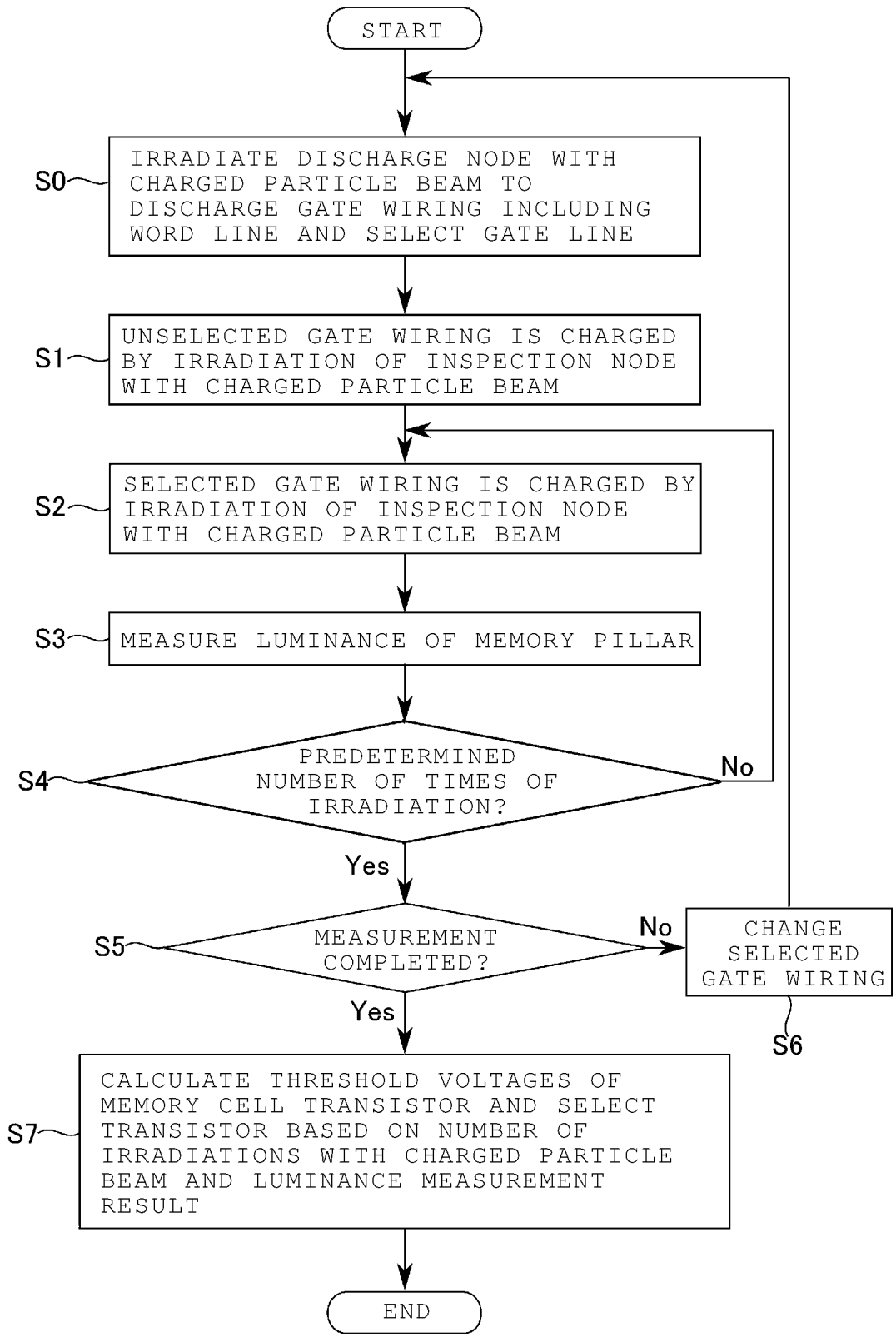
FIG. 12 is a flowchart of a test operation of a memory device according to a first embodiment.
Figure 13:
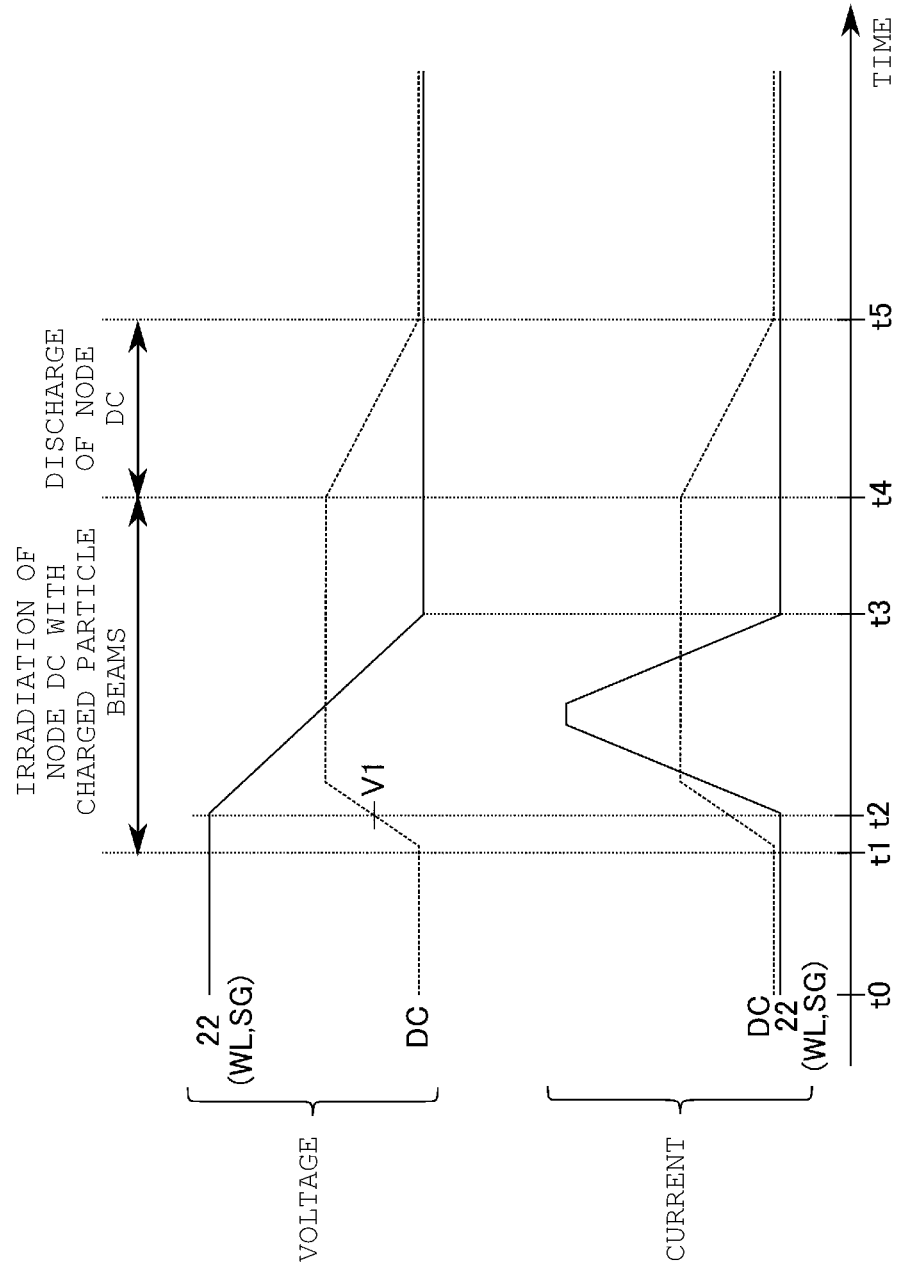
FIG. 13 is a timing chart of a test operation of a memory device according to a first embodiment.

FIG. 12 is a flowchart showing the test operation of the memory device 1 according to the present embodiment. FIG. 13 is a timing chart showing the test operation of the memory device 1 according to the present embodiment. In FIG. 13, the horizontal axis of the graph corresponds to time, and the vertical axes of the graph correspond to the voltage and the current, respectively. FIGS. 14A to 14D are schematic diagrams illustrating the test operations of the memory device 1 according to the present embodiment. FIG. 15 is a graph showing the operation state of the test control circuit 19 in the memory device 1 according to the present embodiment. In FIG. 15, the horizontal axis of the graph indicates the voltage, and the vertical axis of the graph indicates the current.

<S0>

As illustrated in FIG. 12, the test device 9 starts the test operation on the memory device 1 according to the present embodiment. The controller 95 of the test device 9 performs various kinds of control for the test operation.

The memory device 1 performs the discharge process (also referred to as a reset process or a destaticization process) on the gate wiring 22 as the word lines WL and the select gate lines SGD and SGS.

In the present embodiment, the test control circuit 19 in the memory device 1 is driven by the irradiation with the charged particle beam from the charged particle beam irradiation unit 91 of the test device 9.

Figure 14A:
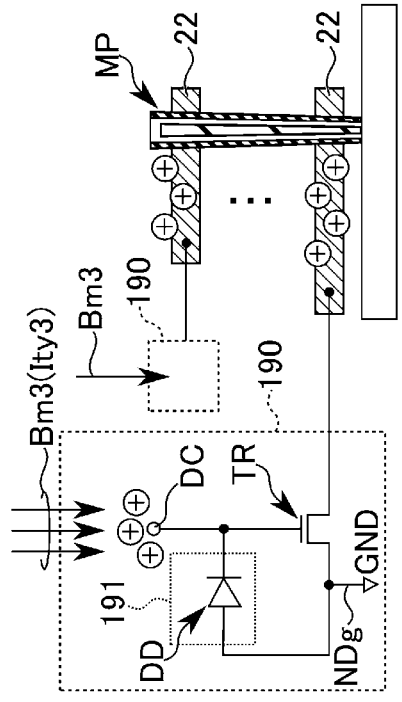
FIGS. 14A to 14D are diagrams illustrating aspects related to test operations of a memory device according to a first embodiment.
Figure 15:
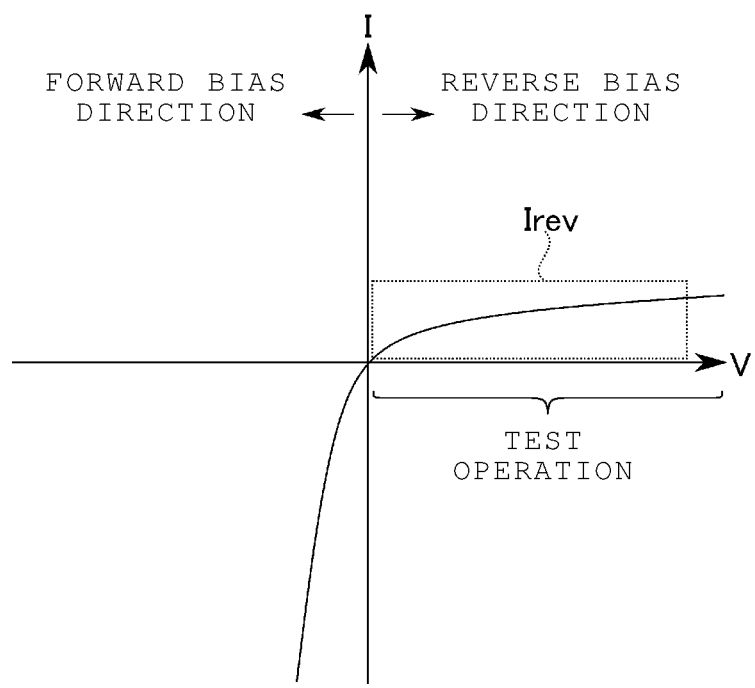
FIG. 15 is a diagram illustrating aspects related to a test operation of a memory device according to a first embodiment.

As illustrated in FIGS. 13 and 14A, at the time of starting the test operation (time t0), the gate wiring 22 of the memory device 1 in the wafer 900 is electrified according to the manufacturing process performed on the wafer 900, the test operation performed before the time t0, or the like. For example, the gate wiring 22 stores positive charges. At the time t0, the voltage of the gate wiring 22 has a positive voltage value higher than 0 V.

Figure 14B:
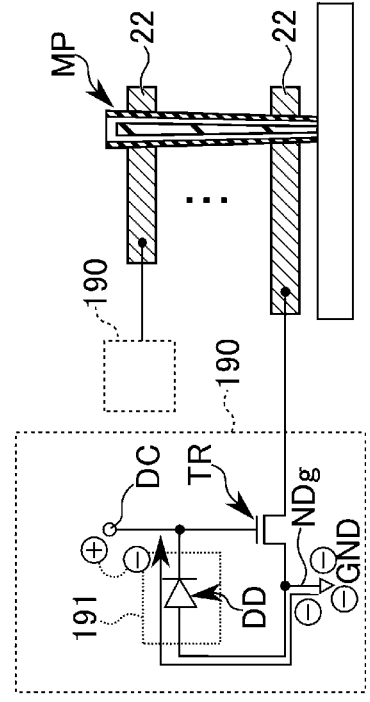

As illustrated in FIG. 14B, the controller 95 irradiates the discharge node DC (the conductive layer 71) with a charged particle beam Bm3 at a predetermined intensity Ity3 by the charged particle beam irradiation unit 91. The discharge node DC is electrified by the applied charged particle beam Bm3. The discharge node DC stores positive charges. Accordingly, in the test control circuit 19, each of the control units 190 is activated.

As illustrated in FIG. 13, at the time t1, after the charged particle beam Bm3 is applied, the voltage of the discharge node DC increases to the positive voltage value.

By the electrification of the discharge node DC, the positive voltage is applied to the gate of the field effect transistor TR of the control unit 190 and the cathode of the PN junction diode of the control unit 190.

When the voltage of the discharge node DC reaches a threshold voltage V1 of the field effect transistor TR, the field effect transistor TR is turned on. Accordingly, the control unit 190 can cause the current to flow.

For example, if the discharge node DC is positively electrified, the bias state of the PN junction diode DD enters a reverse bias state.

The irradiation of the discharge node DC with the charged particle beam Bm3 continues during the period of the discharge process of the gate wiring 22. Accordingly, the voltage of the discharge node DC is maintained at a certain voltage value.

Figure 14C:
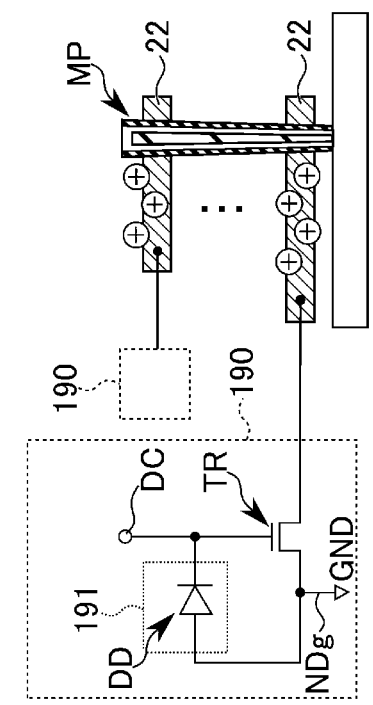

As illustrated in FIG. 14C, an electron (negative charge) is supplied from the ground node NDg in the semiconductor substrate 20 to the corresponding gate wiring 22 via the field effect transistor TR in an on state.

As illustrated in FIG. 13, at time t2, the current is generated according to the voltage difference between the gate wiring 22 and the ground node NDg. The positive charge in the gate wiring 22 is combined with the supplied negative charge and disappears.

Therefore, the voltage of the word line WL decreases by the supply of the electron from the ground node NDg.

At time t3, the voltage of the gate wiring 22 becomes about the ground voltage. If there is no voltage difference between the gate wiring 22 and the ground node NDg, even if the voltage of the discharge node DC is the positive voltage value, the current is not generated between the gate wiring 22 and the ground node NDg.

In this manner, the gate wiring 22 is destaticized. The gate wiring 22 enters an electrically neutral state.

Figure 14D:
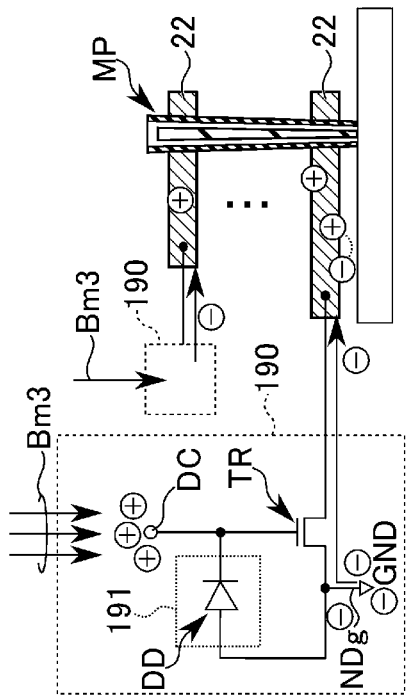

As illustrated in FIG. 14D, the controller 95 stops the irradiation of the discharge node DC with the charged particle beam Bm3. The gate of the field effect transistor TR is grounded to the ground node NDg via the PN junction diode DD.

Immediately after the stopping of the irradiation with the charged particle beam Bm3, the discharge node DC is electrified by the positive charge.

The cathode of the PN junction diode DD is connected to the discharge node DC in the positive electrified state, and the anode of the PN junction diode DD is connected to the ground node NDg. Therefore, as described above, the PN junction diode DD operates in a reverse bias state. As illustrated in FIG. 15, the PN junction diode DD causes a reverse bias current Irev to flow.

The electron is supplied from the ground node NDg to the discharge node DC via the PN junction diode DD in the reverse bias state by the reverse bias current Irev of the PN junction diode DD.

As a result, as illustrated in FIG. 13, during the period from time t4 to time t5, the voltage of the discharge node DC decreases due to the supply of the electron to the discharge node DC. At the time t5, the voltage of the discharge node DC becomes about the ground voltage.

By the discharging (destaticization) of the discharge node DC, the field effect transistor TR enters an off state. Accordingly, in the test control circuit 19, the control unit 190 is deactivated and, in the memory cell array 10, each piece of the gate wiring 22 is electrically separated from the ground node NDg. By the electrical separation from the ground node NDg, each piece of the gate wiring 22 is electrically floated.

As above, the gate wiring 22 (the word lines WL and the select gate lines SGD and SGS) of the memory device 1 is discharged.

<S1>

The controller 95 performs the selection process on the plurality of pieces of gate wiring 22. The controller 95 selects one gate wiring 22 corresponding to the measurement target among the plurality of pieces of gate wiring 22 based on the information in the storage unit 94. Also, the controller 95 determines the plurality of pieces of unselect gate wiring 22-UNSEL.

As illustrated in FIG. 10 and described above, after the plurality of pieces of gate wiring 22 are set to an electrically neutral state, the controller 95 irradiates the inspection node 70 connected to the unselect gate wiring 22-UNSEL among the plurality of pieces of gate wiring 22 with the charged particle beam Bm1 at a certain intensity Ity1 by the charged particle beam irradiation unit 91. The intensity Ity1 of the charged particle beam Bm1 irradiated with the unselect gate wiring 22-UNSEL has a size sufficient for turning on the transistors MT and ST (STD and STS).

By the electrification of the inspection node 70 by the charged particle beam Bm1, the voltage of the unselect gate wiring 22-UNSEL has a value equal to or larger than the threshold voltage of the transistor MT or ST.

Accordingly, the memory cell transistor MT and the select transistor ST connected to the unselect gate wiring 22-UNSEL are turned on.

<S2>

After the transistor MT or ST of the unselect gate wiring 22-UNSEL is turned on, the controller 95 irradiates the inspection node 70 connected to the select gate wiring 22-SEL with the charged particle beam Bm2 at a certain intensity Ity2.

The voltage of the select gate wiring 22-SEL increases by the electrification of the inspection node 70 by the charged particle beam Bm2.

As described above, at one time of the irradiation, the intensity Ity2 of the charged particle beam Bm2 supplied to the select gate wiring 22-SEL is smaller than the intensity Ity1 of the charged particle beam Bm1 supplied to the unselect gate wiring 22-UNSEL. Therefore, the amount of increase in the voltage of the select gate wiring 22-SEL by the irradiation with the charged particle beam Bm2 one time is smaller than the amount of increase in the voltage of the unselect gate wiring 22-UNSEL by the irradiation with the charged particle beam Bm1 one time.

The memory cell transistor MT or the select transistor ST connected to the select gate wiring 22-SEL forms a channel in the semiconductor layer 31 of the memory pillars MP according to the voltage of the select gate wiring 22-SEL. Accordingly, the memory cell transistor MT or the select transistor ST connected to the select gate wiring 22-SEL causes the current having the size in accordance with the voltage of the select gate wiring 22-SEL to flow into the semiconductor layer 31 of the memory pillar MP.

Further, in order to give the voltage difference between the bit lines BL and the source line SL, the bit lines BL (or the source line SL) may be electrified by the charged particle beam.

<S3>

The detector 92 of the test device 9 detects the charge that is present in the semiconductor layer 31 of the memory pillar MP. The detector 92 generates the electron image based on the detected charge.

The calculator 93 of the test device 9 calculates the luminance (VC) in accordance with the current (or a channel formed in the memory pillars MP) flowing the memory pillar MP based on the electron image generated by the detector 92.

Accordingly, the luminance of the memory pillar MP is measured.

<S4>

In the test device 9, the controller 95 determines whether the number of times the select gate wiring 22-SEL has been irradiated with the charged particle beam Bm2 reaches a predetermined number (j times).

If the number of times the select gate wiring 22-SEL has been irradiated with the charged particle beam Bm2 has not reached a predetermined number of times (No in S4), the controller 95 repeats the processes of S2 and S3 described above.

When the luminance of the memory pillar MP to the select gate wiring 22-SEL is measured, the control unit 190 is in a deactivated state, and thus the select gate wiring 22-SEL and the unselect gate wiring 22-UNSEL are in an electrically floating state.

Therefore, the voltage of the select gate wiring 22-SEL gradually increases with the irradiation by the charged particle beam Bm2 without resetting (discharging) between changes in the applied voltage. In addition, the voltage of the unselect gate wiring 22-UNSEL is maintained and the transistor of the unselect gate wiring 22-UNSEL is kept in an on state.

For example, the controller 95 stores the information relating to the detection result in the storage unit 94.

<S5>

If the number of times the select gate wiring 22-SEL is irradiated with the charged particle beam Bm2 reaches the predetermined number (Yes in S4), the controller 95 determines whether the inspection on the entire gate wiring 22 to be measured has been completed.

<S6>

If the controller 95 determines that the inspection of all gate wirings 22 set as targets of the test operation is not completed based on the history of the test operation of the memory device 1 (No in S5), the controller 95 changes the select gate wiring 22-SEL (and the unselect gate wiring 22-UNSEL) to a different gate wiring 22.

Thereafter, the controller 95 performs the processes from S0 to S4 in order to inspect the changed select gate wiring 22-SEL.

<S7>

If the controller 95 determines that the inspection on the entire gate wiring 22 to be measured is completed (Yes in S5), the controller 95 ends the process of measuring the luminance for causing the current to flow the memory pillar MP in the memory device 1.

The controller 95 calculates the threshold voltages of the memory cell transistor MT and the select transistors STD and STS with the calculator 93, by using information in the storage unit 94 based on the number of times the select gate wiring 22-SEL has been irradiated with the charged particle beam Bm2 and the intensity of the measured luminance.

The controller 95 evaluates and classifies the characteristics (quality) of the memory device 1 based on the calculated threshold voltages.

As described above, the test operation of the memory device 1 according to the present embodiment is performed.

Further, in the above description, the test control circuit 19 and the test operation of the memory device 1 according to the present embodiment when the transistor of which the test operation on the memory device 1 is to be measured has a positive threshold voltage are described. Even if the transistor of which the test operation is to be measured in the memory device 1 has a negative threshold voltage, the test control circuit 19 and the test operation described above can be applied. However, in this case, the polarity of the field effect transistor TR used in the control unit 190 of the test control circuit 19 and the polarity of the load unit 191 are reversed from the example described above. For example, if the transistor to be measured has a negative threshold voltage, the anode of the diode as the load unit 191 is connected to the discharge node DC, and the cathode of the diode is connected to the ground node NDg. In addition, the field effect transistor TR of the p channel is used for the control unit 190.

The memory device 1 according to the present embodiment is formed by a well-known technique. Accordingly, the description relating to the method of manufacturing the memory device 1 according to the present embodiment is omitted. The memory device 1 according to the present embodiment performs a write sequence, a read sequence, and erasing sequence according to the well-known operation sequence. Accordingly, the description of the operations of the memory device according to the present embodiment is omitted.

(c) Conclusion

In a conventional memory device, during the test (for example, in-line inspection) of the memory device, the gate wiring (the word line and the select gate line) in the memory cell array is electrified by performing the manufacturing process or the test operation.

However, when the memory device does not have a mechanism for destaticizing gate wiring during a test operation, the gate wiring can be destaticized by self-discharging or exposure to vacuum. The destaticization of the gate wiring by self-discharging requires a relatively long period (for example, 1 to 3 days). The destaticization of the gate wiring by exposure to vacuum requires exposure to vacuum multiple times.

Therefore, in view of the length of the test period for the memory device, the inspection of each of a plurality of pieces of gate wiring or the performance of a plurality of kinds of inspection is difficult for a conventional memory device.

However, a memory device according to an embodiment includes the test control circuit 19 having the plurality of control units 190. The plurality of control units 190 are connected to the plurality of pieces of gate wiring 22 (the word lines WL and the select gate lines SGD and SGS) of the memory cell array 10, respectively.

Thus, during the test on the memory device 1, the memory device 1 of an embodiment can discharge the gate wiring 22 (the word lines WL and the select gate lines SGD and SGS) of the control unit 190 of the test control circuit 19.

Accordingly, the memory device 1 according to the first embodiment can shorten the time for discharging the gate wiring 22.

As a result, each of the plurality of pieces of gate wiring 22 in the memory cell array 10 can be inspected in the memory device 1 or a plurality of kinds of inspection can be performed on the memory device 1, without prolonging the test period of the memory device 1 as compared to a conventional device.

As described above, the memory device 1 according to the first embodiment can improve the efficiency in manufacturing.

(2) Second Embodiment

A memory device according to a second embodiment is described with reference to FIGS. 16 to 21.

According to the first embodiment described above, a PN junction diode DD is used for the load unit 191 of the control unit 190 of the test control circuit 19.

However, so long as the element can contribute to discharge the gate wiring (conductive layer) 22, a discharge element other than a diode may be used for the load unit 191 of the control unit 190.

Figure 16:
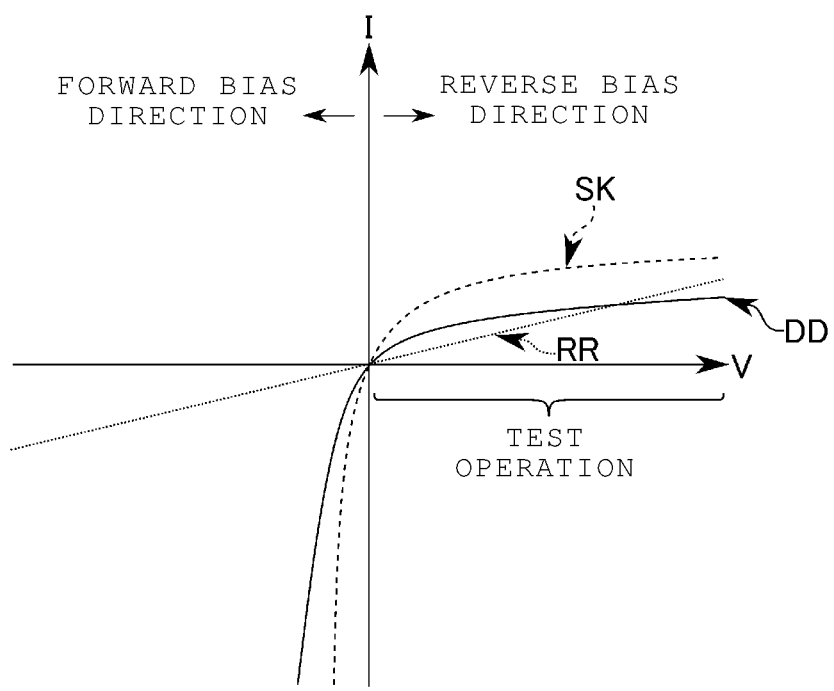
FIG. 16 is a diagram illustrating operational characteristics of a test control circuit of a memory device according to a second embodiment.

FIG. 16 is a graph illustrating I-V characteristics of elements DD, RR, and SK used for the load unit 191. In FIG. 16, the horizontal axis of the graph corresponds to the voltage, and the vertical axis of the graph corresponds to the current.

As illustrated in FIG. 16, under the bias condition in which the voltage of the discharge node DC is higher than the voltage of the ground node NDg, like the PN junction diode DD, the element RR or SK used for the load unit 191 may be an element that can output the current under a certain bias condition.

For example, the resistance element RR or Schottky barrier diodes SK (SKa or SKb) is used for the load unit 191.

Figure 17:
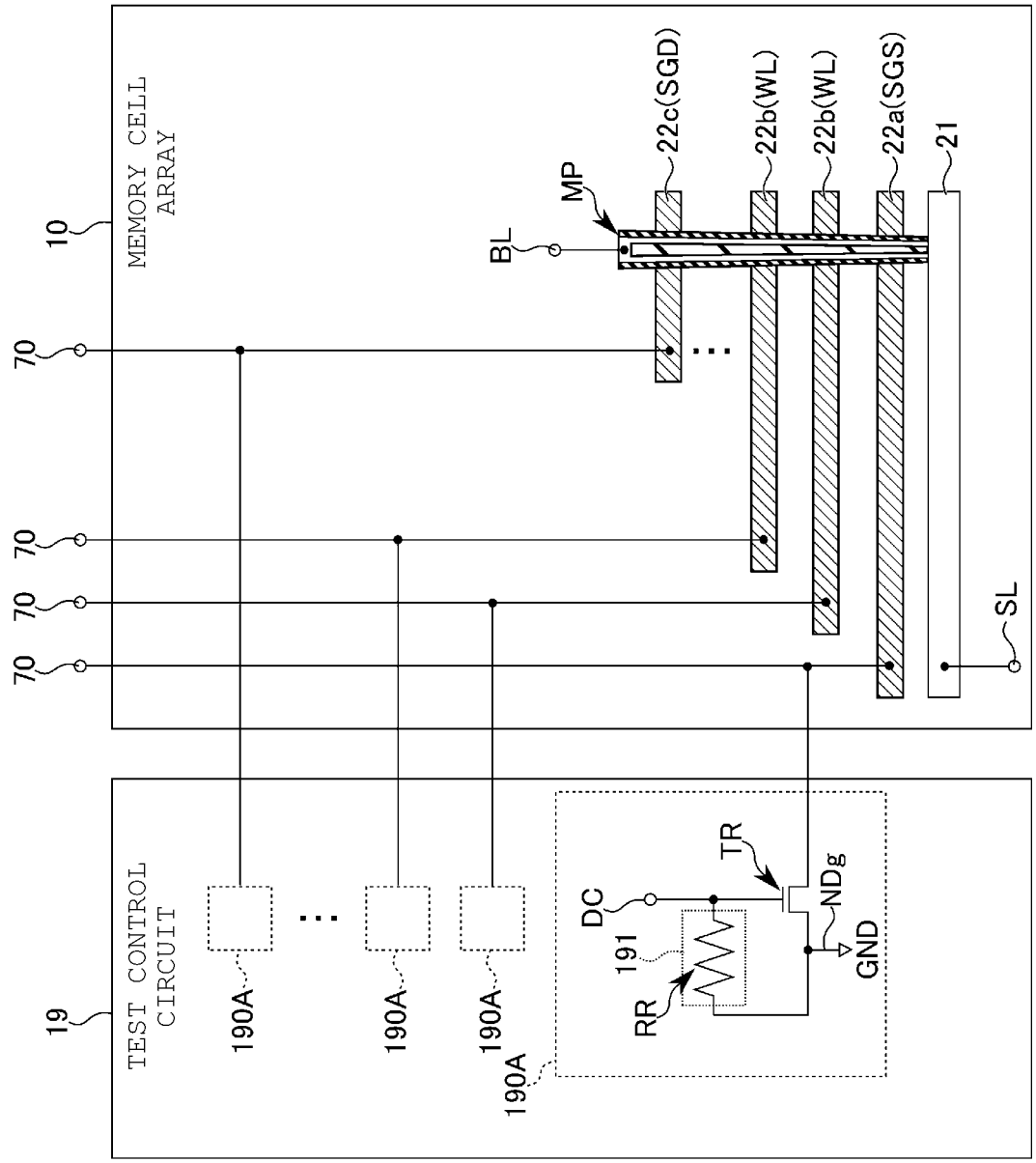
FIG. 17 is a circuit diagram of a test control circuit of a memory device according to a second embodiment.
Figure 18:
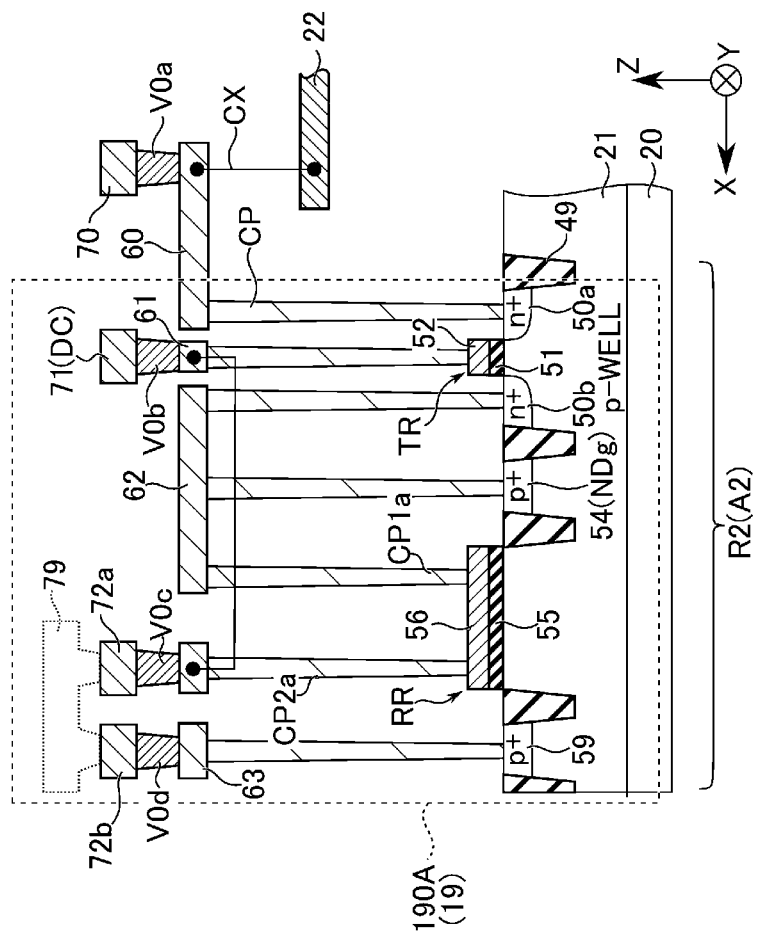
FIG. 18 is a cross-sectional view of a test control circuit of a memory device according to a second embodiment.

FIGS. 17 and 18 illustrate configuration examples of a control unit 190A in the test control circuit 19 of the memory device 1 according to the second embodiment.

FIG. 17 is a circuit diagram illustrating a circuit configuration of the control units 190A according to the second embodiment.

As illustrated in FIG. 17, the load unit 191 includes the resistance element RR (resistor).

One end of the resistance element RR is connected to the ground node NDg and the other end of the current path of the field effect transistor TR.

The other end of the resistance element RR is connected to the discharge node DC and the gate of the field effect transistor TR.

FIG. 18 is a cross-sectional view illustrating a structural example of the control unit 190A according to the second embodiment.

As illustrated in FIG. 18, the resistance element RR is provided on the p-type well region 21.

The resistance element RR includes an insulating layer 55 and a resistance layer 56.

The insulating layer 55 is provided on the upper surface of the p-type well region 21. The insulating layer 55 includes, for example, silicon oxide.

The resistance layer 56 is provided on the insulating layer 55. The resistance layer 56 is electrically separated from the p-type well region 21 by the insulating layer 55. The resistance layer 56 comprises, for example, silicon.

The contact CP1a is provided on one end of the resistance layer 56. One end of the resistance layer 56 is connected to the impurity semiconductor layer 54 of the ground node NDg via the contact CP1a and the conductive layer 62.

A contact CP2a is provided on the other end of the resistance layer 56. The other end of the resistance layer 56 is connected to the conductive layer 71 of the discharge node DC via the contact CP2a, the conductive layer 61, and the via V0b.

Furthermore, the resistance element RR may be connected to the conductive layers 61 and 62 of the wiring level M0 on the upper layer by a plurality of contacts stacked in the Z direction.

Figure 19:
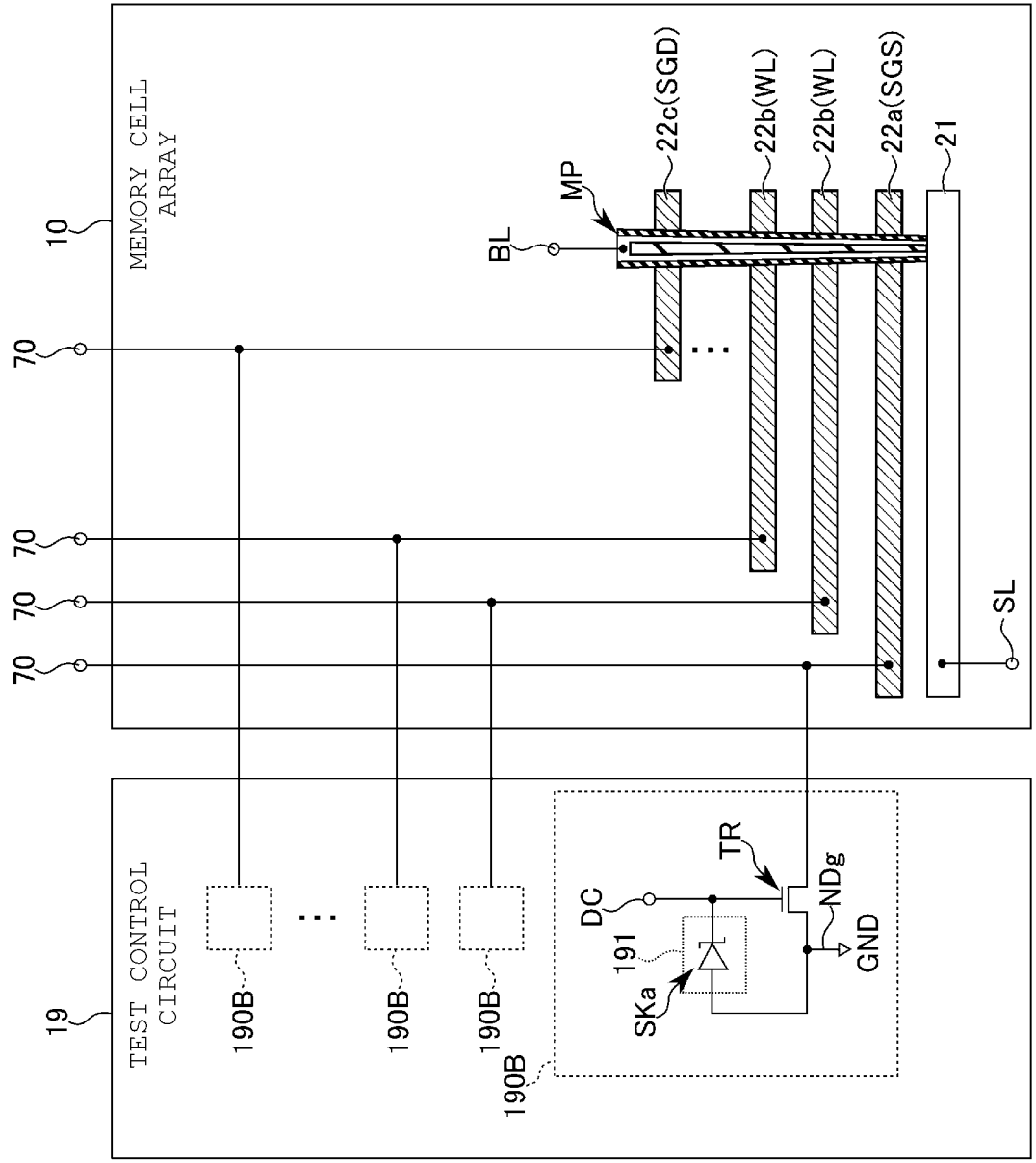
FIG. 19 is a circuit diagram of a test control circuit of a memory device according to a second embodiment.
Figure 20:
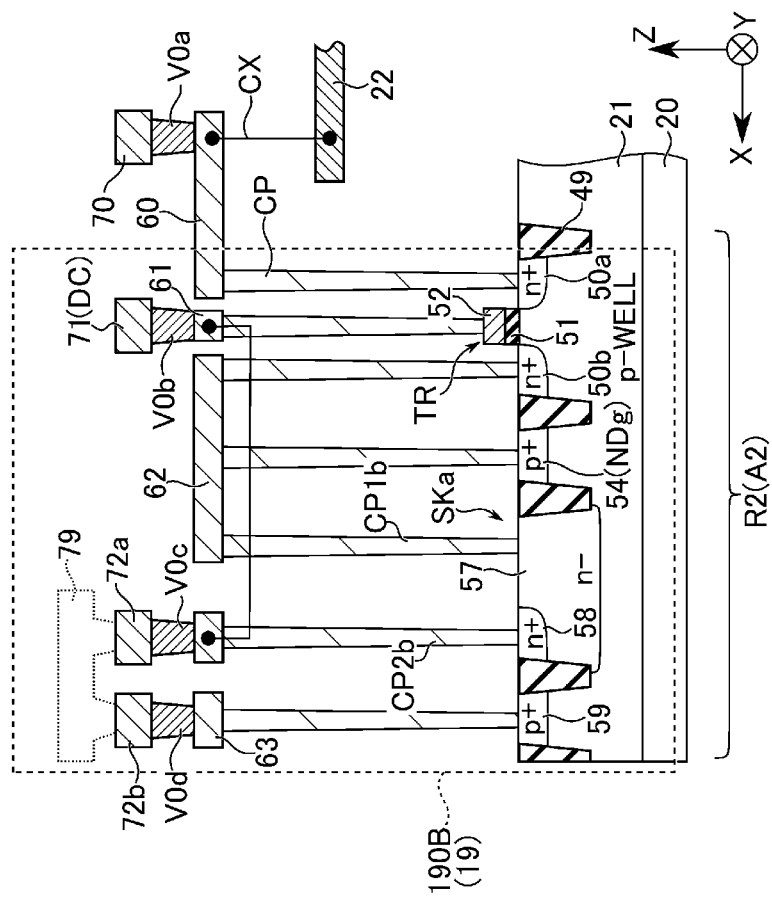
FIG. 20 is a cross-sectional view of a test control circuit of a memory device according to a second embodiment.

FIGS. 19 and 20 illustrate configuration examples of a control unit 190B of the test control circuit 19 of the memory device 1 according to the second embodiment.

FIG. 19 is a circuit diagram illustrating the circuit configuration of the control unit 190B according to the second embodiment.

As illustrated in FIG. 19, the load unit 191 includes the Schottky barrier diode SKa.

The anode of the Schottky barrier diode SKa is electrically connected to the ground node NDg and the other end of the current path of the field effect transistor TR.

The cathode of the Schottky barrier diode SK is electrically connected to the discharge node DC and the gate of the field effect transistor TR.

FIG. 20 is a cross-sectional view illustrating the structural example of the control unit 190B according to the second embodiment.

As illustrated in FIG. 20, the Schottky barrier diode SKa includes a well region 57 and an impurity semiconductor layer 58.

The well region 57 is provided in the p-type well region 21. The well region 57 is a low-concentration n-type semiconductor region.

The impurity semiconductor layer 58 is provided in the n-type well region 57. The impurity semiconductor layer 58 is a high-concentration n-type semiconductor region. The concentration of the n-type dopant of the impurity semiconductor layer 58 is higher than the concentration of the n-type dopant of the n-type well region 57.

A contact CP1b is provided on the well region 57. The contact CP1b has a metal layer.

The well region 57 is electrically connected to the impurity semiconductor layer 54 as the ground node NDg via the contact CP1b and the conductive layer 62.

A contact CP2b is provided on the impurity semiconductor layer 58. The contact CP2b is a metal layer.

The impurity semiconductor layer 58 is electrically connected to the conductive layer 71 as the discharge node DC via the contact CP2b, the conductive layer 61, and the via V0b.

The n-type well region 57 corresponds to the cathode of the Schottky barrier diode SKa. The contact CP1b corresponds to the anode of the Schottky barrier diode SKa. For example, a Schottky barrier is formed between the well region 57 and the contact CP1b.

The structure of the Schottky barrier diode SK is not limited to the example of FIG. 20.

Figure 21:
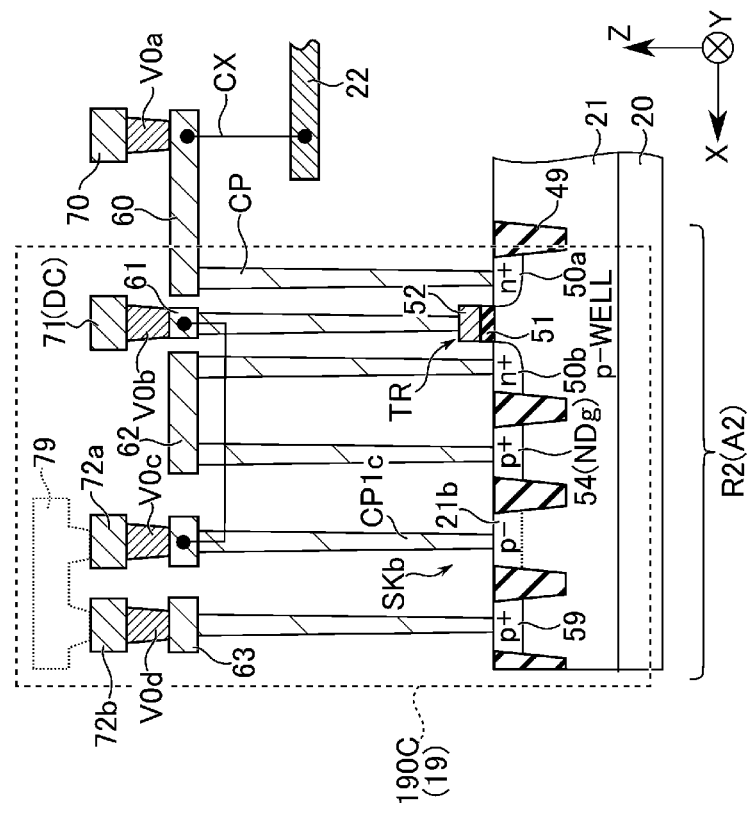
FIG. 21 is a cross-sectional view of a test control circuit of a memory device according to a second embodiment.

FIG. 21 is a cross-sectional view illustrating the structural example of a control unit 190C according to the present embodiment.

As illustrated in FIG. 21, the Schottky barrier diode SKb includes an impurity semiconductor layer 21b.

For example, the impurity semiconductor layer 21b is provided in the p-type well region 21. The impurity semiconductor layer 21b is a low-concentration p-type semiconductor region. For example, the impurity semiconductor layer 21*b* is a semiconductor region that is continuous with the p-type well region 21.

A contact CP1*c* is provided on the impurity semiconductor layer 21*b*. The contact CP1*c* is a metal layer.

For example, a Schottky barrier is formed between the contact CP1*c* and the impurity semiconductor layer 21*b*. The impurity semiconductor layer 21*b* corresponds to the anode of the Schottky barrier diode SKb. The contact CP1*c* corresponds to the cathode of the Schottky barrier diode SKb.

The impurity semiconductor layer 21*b* as the anode of the Schottky barrier diode SKb is electrically connected to the impurity semiconductor layer 54 as the ground node NDg via the p-type well region 21. The contact CP1*c* as the cathode of the Schottky barrier diode SKb is electrically connected to the conductive layer 71 as the discharge node DC via the conductive layer 61 and the via V0*b*.

In this manner, in the test control circuit 19 of the memory device 1 according to the present embodiment, the control units 190A, 190B, and 190C each can configure the load unit 191 by using an element other than the PN junction diode DD.

Accordingly, the memory device 1 according to the second embodiment can obtain an effect that is substantially the same as the first embodiment.

(3) Third Embodiment

A memory device according to a third embodiment is described with reference to FIGS. 22 and 23.

Figure 22:
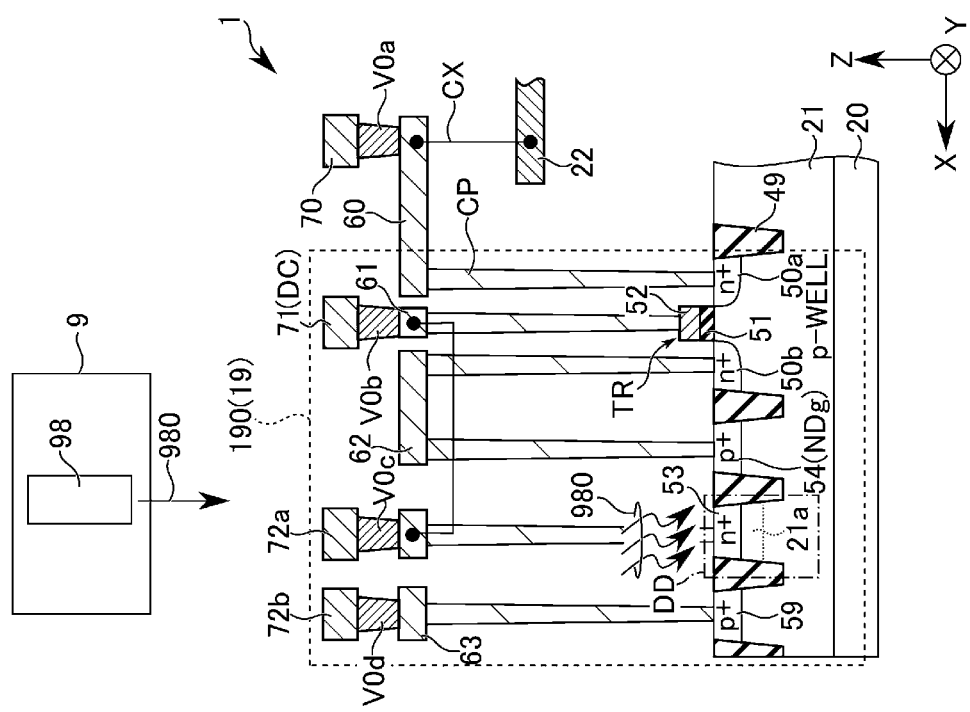
FIG. 22 is a diagram illustrating aspects of a test operation of a memory device according to a third embodiment.

FIG. 22 is a schematic diagram illustrating a test operation of the memory device 1 according to the third embodiment.

Figure 23B:
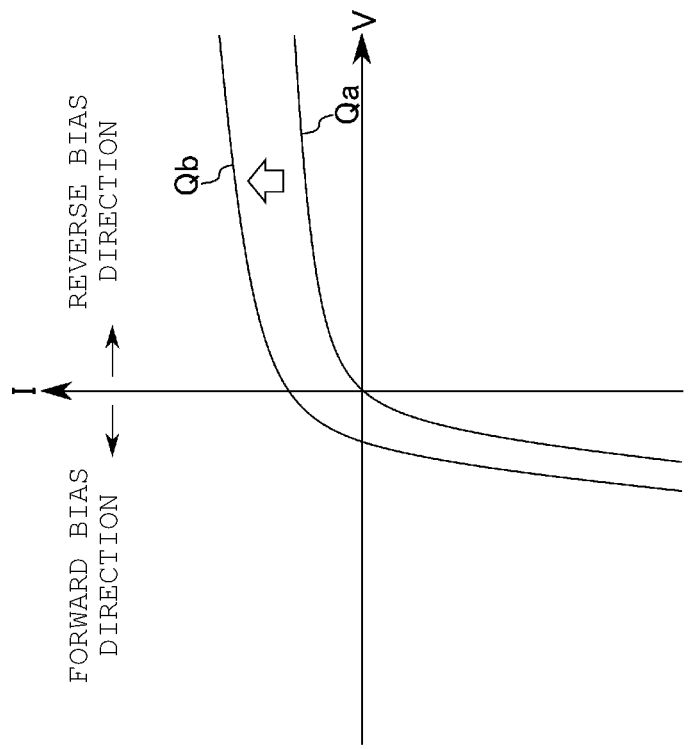
FIGS. 23A and 23B are diagrams illustrating aspects related to a test operation of a memory device according to a third embodiment.
Figure 23A:
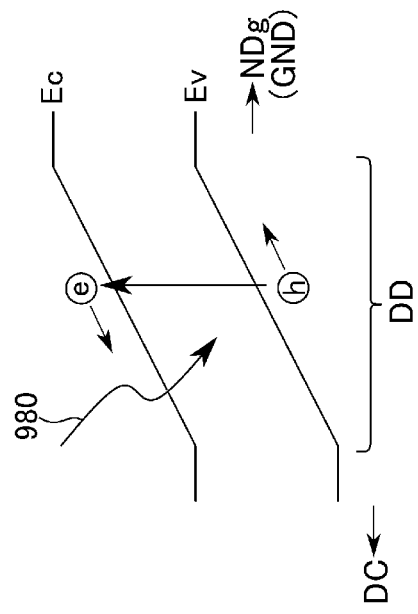

FIG. 23 is a schematic diagram illustrating the principle of the test operation of the memory device 1 according to the third embodiment. FIG. 23A is a schematic diagram illustrating an operational principle of the control unit 190 in the test operation of the memory device 1 according to the third embodiment. FIG. 23B is a graph illustrating an operational characteristic of the control unit 190 during the test operation of the memory device 1 according to the third embodiment. In FIG. 23B, the horizontal axis of the graph indicates the voltage, and the vertical axis of the graph indicates the current.

In the test control circuit 19, the discharge node DC is discharged by outputting the current of the PN junction diode DD or the Schottky barrier diode SK under a reverse bias condition.

A semiconductor element such as a diode causes generation and recombination current to flow when irradiated with light.

As illustrated in FIG. 22, according to the third embodiment, during the discharge process of the discharge node DC in the test operation, an optical output unit 98 of the test device 9 irradiates the control unit 190 with light 980. The light 980 is incident to the PN junction diode DD.

Accordingly, as illustrated in FIG. 23A, in the PN junction diode DD, holes in a valence band (Ev) are excited to a conduction band (Ec) by the applied light.

As a result, the PN junction diode DD (or the Schottky barrier diode SK) in the control unit 190 causes the generation and recombination current to flow in addition to a diffusion current in accordance with the applied voltage.

In FIG. 23B, a characteristic Qa indicates the I-V characteristic of the PN junction diode DD when the light is not applied, and a characteristic Qb indicates the I-V characteristic of the PN junction diode DD when the light is applied.

As illustrated in FIG. 23B, by the irradiation with light during the test operation, the I-V characteristic of the PN junction diode DD is changed from the characteristic Qa to the characteristic Qb.

Accordingly, according to the increase of the generation and recombination current by the irradiation with light, the output current of the PN junction diode DD increases.

Therefore, according to the third embodiment, the control unit 190 can reduce the time for discharging the discharge node DC.

As a result, during the test operation, the memory device 1 according to the third embodiment can reduce the period of a transition from a one measurement cycle to the next.

Accordingly, the memory device 1 according to the third embodiment can improve the efficiency of manufacturing.

(4) Fourth Embodiment

A memory device according to a fourth embodiment is described with reference to FIG. 24.

Figure 24:
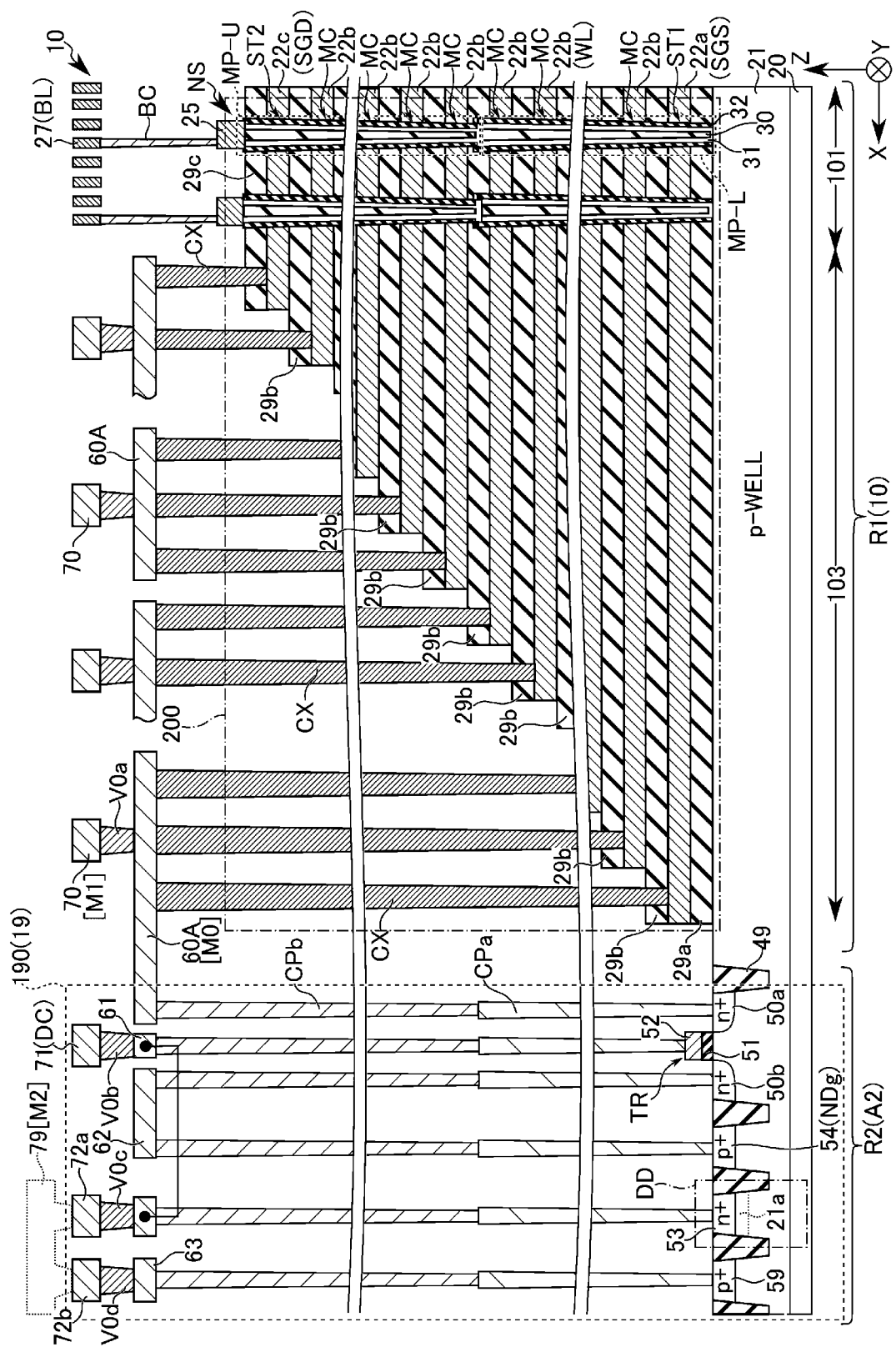
FIG. 24 is a cross-sectional view of a memory device according to a fourth embodiment.

FIG. 24 is a cross-sectional view illustrating the structural example of the memory device according to the fourth embodiment.

As illustrated in FIG. 24, one control unit 190 may be provided for a plurality of pieces of gate wiring 22.

In the hookup area 103 on the test control circuit area A2 side, a predetermined number of pieces of gate wiring 22 are connected to a common conductive layer 60A via the corresponding contacts CX. The conductive layer 60A is connected to the inspection node 70. Accordingly, the plurality of pieces of gate wiring 22 are connected to one inspection node 70.

One control unit 190 is connected to the conductive layer 60A via the contacts CP (CPa and CPb). Accordingly, one control unit 190 is electrically connected to the plurality of pieces of gate wiring 22. During the test operation, one control unit 190 can control the discharge of the plurality of pieces of connected gate wiring 22.

In this configuration, the plurality of transistors MT, STD, and STS respectively corresponding to the plurality of pieces of gate wiring 22 connected to one inspection node 70 are set as one unit for inspection.

That is, the plurality of transistors MT, STD, and STS corresponding to one control unit 190 are selected as measurement targets of the inspection (measurement of luminance) as the unit matching the plurality of pieces of bundled gate wiring 22.

By bundling of the gate wiring 22, the number of individual selections of the gate wiring 22 is reduced.

Accordingly, the memory device 1 according to the fourth embodiment can reduce the period of the test operation.

As above, the memory device 1 according to the fourth embodiment can improve the efficiency of manufacturing.

(5) Fifth Embodiment

A memory device according to a fifth embodiment is described with reference to FIG. 25.

The test control circuit 19 need not necessarily be provided near the memory cell array 10.

Figure 25:
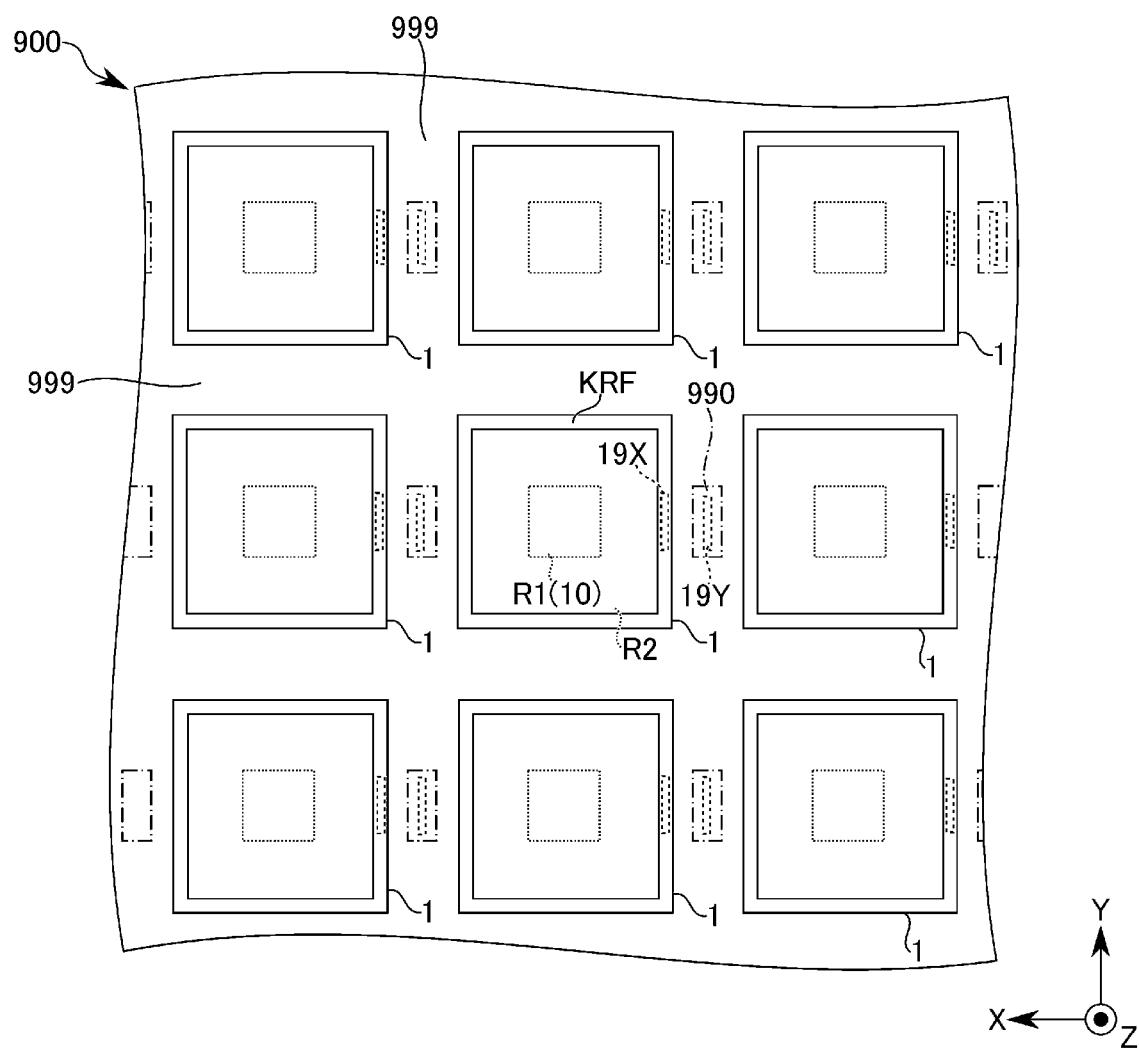
FIG. 25 is a plan view of a memory device according to a fifth embodiment.

FIG. 25 is a top view illustrating the structural example of the memory device 1 according to the fifth embodiment. In FIG. 25, the memory device 1 in the state before the wafer is diced is illustrated.

For example, a test control circuit 19X may be provided in a kerf area KRF. The kerf area KRF is an area of an outer edge of a chip of the memory device 1. The kerf area KRF is provided in the end portion of the chip of the memory device 1. For example, the kerf area KRF is disposed between the peripheral area R2 in the chip of the memory device 1 and a dicing area 999 of the wafer 900.

In addition, a test control circuit 19Y may be provided in a certain area 990 of the dicing area 999 of the wafer 900.

As described above for other embodiments, in the test control circuit 19Y, the control unit 190 is disabled after the test step of the memory device 1 (when the memory device 1 is in use (end use)). Therefore, the test control circuit 19Y provided in the dicing area 999 may be removed from the memory device 1 during the dicing of the wafer 900 performed after the test step.

According to the fifth embodiment, even if the test control circuits 19X and 19Y and the control unit 190 are not disposed near the memory cell array 10, the test operations can be performed on the memory device 1 in a manner as described above for other embodiments.

Accordingly, the memory device 1 according to the fifth embodiment can obtain substantially the same effect as the embodiments described above.

(6) Others

The structure of the memory device according to an embodiment is not limited to the structures described above. For example, so long as the test operation can be performed by a test control circuit as described above, a memory device according to an embodiment may include a structure provided in an area where a peripheral circuit is vertically overlapped with a memory cell array in the Z direction.

A memory device according to an embodiment is not limited to NAND-type flash memory. A memory device according to an embodiment may be a NOR-type flash memory, a dynamic random access memory (DRAM), a static random access memory (SRAM), or a magnetoresistive random access memory (MRAM).

As a device according to an embodiment, a memory device is exemplified. However, a device according to an embodiment is not limited to a memory device. For example, a device according to an embodiment may be a semiconductor device such as a semiconductor integrated circuit or an image sensor.

The test method of a memory device according to an embodiment is performed on memory devices while still on the wafer (e.g., a pre-wafer dicing stage). However, the test method of a memory device according to an embodiment may be performed on a chip-shaped memory device after the wafer has been diced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device, comprising:
a memory cell array that includes:
a plurality of pieces of gate wiring, and
a plurality of memory cell transistors and a plurality of select transistors electrically connected to the plurality of pieces of gate wiring; and
a test control circuit that includes a plurality of control units electrically connected to the plurality of pieces of gate wiring, the test control circuit configured to control discharging of the plurality of pieces of gate wiring during a test of the memory cell array, wherein
the control units each include:
a field effect transistor that includes:
a gate electrically connected to a first node,
one end electrically connected to at least one corresponding piece among the plurality of pieces of gate wiring, and
another end electrically connected to a second node that is grounded, and
a load unit that is electrically connected between the first node and the second node,
when the plurality of pieces of gate wiring are being discharged, the field effect transistor is set as an on state,
the plurality of pieces of gate wiring each are electrically connected to the second node via the field effect transistor in the on state, and
the load unit discharges the first node after the plurality of pieces of gate wiring are discharged.

2. The memory device according to claim 1, wherein, when the plurality of pieces of gate wiring are being discharged, the first node can be irradiated with a charged particle beam and the field effect transistor is turned on.

3. The memory device according to claim 1, wherein a select gate wiring among the plurality of pieces of gate wiring can be irradiated with a charged particle beam after the plurality of pieces of gate wiring are discharged, and a current flows through a memory cell transistor or a select transistor that is electrically connected to the select gate wiring according to the irradiation with the charged particle beam.

4. The memory device according to claim 1, wherein the load unit is a Schottky barrier diode.

5. The memory device according to claim 1, wherein the load unit includes a diode,
a cathode of the diode is electrically connected to the first node, and
an anode of the diode is electrically connected to the second node.

6. The memory device according to claim 1, wherein the load unit includes a PN junction diode.

7. The memory device according to claim 1, wherein the load unit is a resistance element.

8. A memory device, comprising:
a memory cell array that includes:
a stacked body including a plurality of pieces of gate wiring spaced from one another in a first direction orthogonal to a first surface of a semiconductor substrate, and
a plurality of memory pillars extending in the first direction through the stacked body; and
a test control circuit on the semiconductor substrate, the test control circuit including a plurality of control units electrically connected to the plurality of pieces of gate wiring and configured to control discharging of the plurality of pieces of gate wiring during a test of the memory cell array, wherein
the control units each include:
a field effect transistor that includes:
a gate electrode provided above the semiconductor substrate via a gate insulation layer,
a first source/drain layer provided in the semiconductor substrate, and a second source/drain layer provided in the semiconductor substrate, a first conductive layer above the semiconductor substrate, a first semiconductor layer in the semiconductor substrate, and a load unit that is electrically connected between the first conductive layer and the first semiconductor layer, the gate electrode is electrically connected to the first conductive layer, the first source/drain layer is electrically connected to at least one corresponding piece among the plurality of pieces of gate wiring, and the second source/drain layer is electrically connected to the first semiconductor layer.

9. The memory device according to claim 8, wherein the load unit includes:

an n-type second semiconductor layer in the semiconductor substrate and electrically connected to the first conductive layer, and a p-type third semiconductor layer that is adjacent to the second semiconductor layer in the semiconductor substrate and electrically connected to the first semiconductor layer.

10. The memory device according to claim 8, wherein the load unit includes:

an n-type fourth semiconductor layer in the semiconductor substrate and electrically connected to the first conductive layer, and a first metal layer on the fourth semiconductor layer and electrically connected to the first semiconductor layer.

11. The memory device according to claim 8, wherein the load unit includes:

a p-type fifth semiconductor layer in the semiconductor substrate and electrically connected to the first semiconductor layer, and a second metal layer on the fifth semiconductor layer and electrically connected to the first conductive layer.

12. The memory device according to claim 8, wherein the load unit includes:

an insulating layer on the semiconductor substrate, and a resistor on the insulating layer and electrically connected between the first conductive layer and the first semiconductor layer.

13. The memory device according to claim 8, further comprising:

a plurality of second conductive layers above the stacked body, wherein a first number of the plurality of pieces of gate wiring among the plurality of pieces of gate wiring is electrically connected to one corresponding second conductive layer among the plurality of second conductive layers.

14. The memory device according to claim 13, wherein one of the plurality of control units is electrically connected to the first number of the plurality of pieces of gate wiring via the one second conductive layer.

15. The memory device according to claim 8, further comprising:

a row decoder circuit configured to control an operation of the memory cell array, wherein the row decoder circuit is on one end side of the memory cell array in a second direction parallel to the first surface, and the test control circuit is on the other end side of the memory cell array in the second direction opposite the row decoder circuit.

16. A method of manufacturing a memory device, the method comprising:

during a test of a plurality of memory cell transistors and a plurality of select transistors that are electrically connected to a plurality of pieces of gate wiring, discharging the plurality of pieces of gate wiring using a test control circuit, the test control circuit including a plurality of control units electrically connected to the plurality of pieces of gate wiring;

irradiating unselected gate wirings of the plurality of pieces of gate wiring with a first charged particle beam and activating the memory cell transistors and the select transistors that are electrically connected to the unselected gate wiring; and irradiating a selected gate wiring among the plurality of pieces of gate wiring with a second charged particle beam and measuring an image luminance based on a current flowing through one corresponding transistor among the memory cell transistors and the select transistors that is electrically connected to the selected gate wiring.

17. The method of manufacturing a memory device according to claim 16, further comprising:

calculating a threshold voltage of the one transistor electrically connected to the selected gate wiring based on the number of times the selected gate wiring has been irradiated with the second charged particle beam and a normalized intensity of the measured luminance.

18. The method of manufacturing a memory device according to claim 16, wherein the control units each include:
a field effect transistor that includes:
a gate that is electrically connected to a first node,
one end electrically connected to at least one corresponding piece among the plurality of pieces of gate wiring, and
another end electrically connected to a second node that is grounded, and
a load unit electrically connected between the first node and the second node, when the plurality of pieces of gate wiring are being discharged, the first node is irradiated with a third charged particle beam and the field effect transistor is turned on, the plurality of pieces of gate wiring each are electrically connected to the second node via the field effect transistor in an on state, and after the irradiation with the third charged particle beam is stopped, the first node is discharged by the load unit.

19. The method of manufacturing a memory device according to claim 18, wherein the load unit includes a diode, and the diode is irradiated with light when the first node is discharged.

20. The method of manufacturing a memory device according to claim 18, wherein the load unit includes a diode, a cathode of the diode is electrically connected to the first node, and an anode of the diode is electrically connected to the second node.

* * * * *